United States Patent
Jeon et al.

(10) Patent No.: US 12,445,151 B2
(45) Date of Patent: Oct. 14, 2025

(54) ERROR CORRECTING CODE ENCODING CIRCUIT AND SEMICONDUCTOR DEVICE INCLUDING THE SAME

(71) Applicant: Samsung Electronics Co., Ltd., Suwon-si (KR)

(72) Inventors: Kijun Jeon, Suwon-si (KR); Kyoungbin Park, Suwon-si (KR); Hong Rak Son, Suwon-si (KR); Dae-Yeol Yang, Suwon-si (KR); Geunyeong Yu, Suwon-si (KR); Bohwan Jun, Suwon-si (KR); Youngjun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 18/520,707

(22) Filed: Nov. 28, 2023

(65) Prior Publication Data
US 2024/0340025 A1    Oct. 10, 2024

(30) Foreign Application Priority Data
Apr. 6, 2023    (KR) .................. 10-2023-0045538

(51) Int. Cl.
*H03M 13/11* (2006.01)
*H03M 13/00* (2006.01)

(52) U.S. Cl.
CPC .... *H03M 13/1185* (2013.01); *H03M 13/1168* (2013.01); *H03M 13/616* (2013.01)

(58) Field of Classification Search
CPC ......... H03M 13/1185; H03M 13/1168; H03M 13/616; H03M 13/116; H03M 13/118;
(Continued)

(56) References Cited

U.S. PATENT DOCUMENTS 7,313,752 B2    12/2007    Kyung et al.
7,395,494 B2    7/2008    Lee et al.
(Continued)

FOREIGN PATENT DOCUMENTS

KR    101447751 B1    10/2014

OTHER PUBLICATIONS

Dariush Divsalar et al., "Capacity-Approaching Protograph Codes," IEEE Journal on Selected Areas in Communications, 2009.
(Continued)

*Primary Examiner* — Steve N Nguyen
(74) *Attorney, Agent, or Firm* — Muir Patent Law, PLLC

(57) ABSTRACT

A semiconductor device may include an error correcting code (ECC) encoder that encodes a codeword based on a parity check matrix and generates the encoded codeword including an information bit and a parity bit. The parity check matrix is divided into an information part corresponding to the information bit and a parity part corresponding to the parity bit. The parity part includes a block matrix T including a plurality of first sub-matrices arranged in a dual diagonal structure, a block matrix B including a first sub-matrix and a (1−a)-th sub-matrix, a block matrix D composed of a first sub-matrix, and a block matrix E including a first sub-matrix and a masked (1−(a+1))-th sub-matrix. A location where the first sub-matrix is placed in the block matrix B precedes a location where the masked (1−(a+1))-th sub-matrix is placed in the block matrix E.

15 Claims, 23 Drawing Sheets

(58) Field of Classification Search
CPC .......... H03M 13/611; H03M 13/1148; H03M 13/6502; G06F 11/1068; G11C 29/42
See application file for complete search history.

(56) References Cited

U.S. PATENT DOCUMENTS

| | | | | |
|---|---|---|---|---|
| 7,984,364 | B2 | 7/2011 | Park et al. | |
| 8,020,062 | B2 | 9/2011 | Jeong et al. | |
| 10,382,064 | B2 | 8/2019 | Yuan et al. | |
| 11,881,871 | B1* | 1/2024 | Zhang | H03M 13/1128 |
| 2004/0148560 | A1* | 7/2004 | Hocevar | H03M 13/118 |
| | | | | 714/801 |
| 2006/0156183 | A1* | 7/2006 | Kim | H03M 13/1185 |
| | | | | 714/758 |
| 2011/0197105 | A1* | 8/2011 | Murakami | H03M 13/616 |
| | | | | 714/752 |
| 2014/0157079 | A1* | 6/2014 | Park | H04L 1/0041 |
| | | | | 714/758 |
| 2017/0201348 | A1* | 7/2017 | Jang | H04L 1/08 |
| 2019/0052287 | A1* | 2/2019 | Park | H03M 13/118 |
| 2019/0238157 | A1* | 8/2019 | Kim | H03M 13/611 |
| 2020/0186168 | A1* | 6/2020 | Wang | H03M 13/6516 |
| 2022/0069842 | A1* | 3/2022 | Jeon | H03M 13/11 |

OTHER PUBLICATIONS

Ki Jun Jeon et al., "Accumulate repeat accumulate check accumulate codes," IEEE Transactions on Communications, 2017.

\* cited by examiner

FIG. 14

| i(Bb, k) | | | Bb |
|---|---|---|---|
| 1 | k=1 | 1 | i=1 |
| | | | i=2 |
| | | | i=3 |
| | | | i=4 |
| | | | i=5 |
| | | | i=6 |
| 7 | k=2 | 1 | i=7 |
| | | | i=8 |
| | | | i=9 |

FIG. 15

| | j=1 | j=2 | j=3 | j=4 | j=5 | j=6 | j=7 | j=8 | j=9 | Eb |
|---|---|---|---|---|---|---|---|---|---|---|
| | | | 1 | | | | | | 1 | |
| | | | k=1 | | | | | | k=2 | |
| j(Eb, k) | | | 3 | | | | | | 9 | |

FIG. 16

| | Mapping Table, Mb'=1 | |
|---|---|---|
| | Data_M | |
| B | $B\_i = \begin{cases} SM1, & \text{If } i=i(Bb, 1) \\ SM1\_a, & \text{else If } i=i(Bb, 2) \\ SM0, & \text{else} \end{cases}$ | T | $T\_i,j = \begin{cases} SM1, & \text{If } Tb\_i, j=1 \\ SM0, & \text{else} \end{cases}$ |
| D | D = SM1 | E | $E\_j = \begin{cases} MSM1\_(a+1), & \text{If } j=j(Eb, 1) \\ SM1, & \text{else If } j=j(Eb, 2) \\ SM0, & \text{else} \end{cases}$ |

| i(Bbc1) | Bbc1 | i(Bbc2) | Bbc2 | |
|---|---|---|---|---|
| 1 | 1 | | | i=1 |
| | | | | i=2 |
| | | | | i=3 |
| | | | | i=4 |
| | | 5 | 1 | i=5 |
| | | | | i=6 |
| | | | | i=7 |
| | | | | i=8 |

| | j=1 | j=2 | j=3 | j=4 | j=5 | j=6 | j=7 | j=8 | |
|---|---|---|---|---|---|---|---|---|---|
| Ebr1 | | | 1 | | | | | | $Eb\_1,j$ |
| j(Ebr1) | | | 3 | | | | | | |
| Ebr2 | | | | | | | | 1 | $Eb\_2,j$ |
| j(Ebr2) | | | | | | | | 8 | |

FIG. 23

| i \ j | j=1 | j=2 |
|---|---|---|
| i=1 | 1 | |
| i=2 | 1 | 1 |

| Mapping Table, M'b≥2 | | |
|---|---|---|
| Data_M | | |
| B | $B\_i,j = \begin{cases} SM1\_aj, & \text{If } Bb\_i,j=1 \\ SM0, & \text{else} \end{cases}$ | T | $T\_i,j = \begin{cases} SM1, & \text{If } Tb\_i,j=1 \\ SM0, & \text{else} \end{cases}$ |
| D | $D\_i,j = \begin{cases} MSM1\_(aj+1), & \text{If } i=j \text{ and } Db\_i,j=1 \\ SM1\_(aj-2), & \text{else if } Db\_i,j=1 \\ 0, & \text{else} \end{cases}$ | E | $E\_i,j = \begin{cases} SM1, & \text{If } Eb\_i,j=1 \\ SM0, & \text{else} \end{cases}$ |

ERROR CORRECTING CODE ENCODING CIRCUIT AND SEMICONDUCTOR DEVICE INCLUDING THE SAME

CROSS-REFERENCE TO RELATED APPLICATION(S)

This application claims priority under 35 U.S.C. § 119 to Korean Patent Application No. 10-2023-0045538 filed on Apr. 6, 2023, in the Korean Intellectual Property Office, the disclosure of which is incorporated by reference herein in its entirety.

BACKGROUND

Embodiments of the present disclosure described herein relate to an error correcting code (ECC) encoder and semiconductor device including the same, and more particularly, relate to an ECC encoder that encodes a codeword to generate the encoded codeword.

Semiconductor devices may include volatile memory devices and nonvolatile memory devices. The volatile memory devices may refer to memory devices that lose data stored therein when power is turned off. The volatile memory devices may include a static random access memory (SRAM), a dynamic ram (DRAM), a synchronous DRAM, and the like. Nonvolatile memory devices may refer to memory devices that retain data stored therein even when power is turned off. The nonvolatile memory device may include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like. Flash memory devices are largely classified into NOR-type flash memory devices and NAND-type flash memory devices.

When data programmed in a memory device is read, an error may occur. When the error occurs during a reading operation, the read data may include errors. To correct errors in the read data, an error correcting code (ECC) operation may be performed using coded modulations such as Bose-Chaudhuri-Hocquenghem (BCH) code, Reed-Solomon (RS) code, Low Density Parity Check (LDPC) code, and Tutbo code. However, due to the continuing shrink in fabrication design rule of semiconductor devices, bit errors may rapidly increase and yield of productivity of semiconductor devices may decrease. Therefore, it is useful to improve efficiency of the ECC operation.

SUMMARY

Embodiments of the present disclosure provide an error correcting code (ECC) encoding circuit using a parity check matrix structure capable of low-complexity encoding while error floor and waterfall characteristics are improved simultaneously, and an LDPC code.

According to an embodiment, an error correcting code (ECC) encoding circuit encodes a codeword based on a parity check matrix and to generate the encoded codeword (ECW) including an information bit and a parity bit. The parity check matrix is divided into an information part corresponding to the information bit and a parity part corresponding to the parity bit. The parity part includes a block matrix T including a plurality of first sub-matrices arranged in a dual diagonal structure, a block matrix B including a first sub-matrix and a (1−a)-th sub-matrix, a block matrix D composed of the first sub-matrix, and a block matrix E including the first sub-matrix and a masked (1−(a+1))-th sub-matrix. The block matrix B and the block matrix D are positioned in the same sub-column. The block matrix T and the block matrix E are positioned in the same sub-column. A location where the first sub-matrix is placed in the block matrix B precedes a location where the masked (1−(a+1))-th sub-matrix is placed in the block matrix E. A location where the (1−a)-th sub-matrix is placed in the block matrix B precedes a location where the first sub-matrix is placed in the block matrix E. The first sub-matrix is defined as a unit matrix having a size of Z×Z. The (1−a)-th sub-matrix is defined as a matrix obtained by performing a left-cyclic shift 'a' times on the first sub-matrix. The masked (1−(a+1))-th sub-matrix is defined as a matrix in which a first row is masked in a matrix obtained by performing a left-cyclic shift "a+1" times on the first sub-matrix.

According to an embodiment, a semiconductor device may include an ECC encoder configured to encode a codeword based on a parity check matrix and to generate the encoded codeword (ECW) including an information bit and a parity bit. The parity check matrix is divided into an information part corresponding to the information bit and a parity part corresponding to the parity bit. The parity part includes a plurality of sub-rows and a plurality of sub-columns, a block matrix T including a plurality of first sub-matrices arranged in a dual diagonal structure, a block matrix B including a first column vector positioned in a first sub-column of the plurality of sub-columns and including a (1−a1)-th sub-matrix, and a second column vector positioned in a second sub-column of the plurality of sub-columns and including a (1−a2)-th sub-matrix, a block matrix E including a first row vector positioned in a first sub-row of the plurality of sub-rows and including a first sub-matrix, and a second row vector positioned in a second sub-row of the plurality of sub-rows and including a first sub-matrix, and a block matrix D including a masked (1−(a1+1))-th sub-matrix positioned in the first sub-column and the first sub-row, a (1−(a1−2))-th sub-matrix positioned in the first sub-column and the second sub-row, and a masked (1−(a2+1))-th sub-matrix positioned in the second sub-column and the second sub-row. A location where the (1−a1)-th sub-matrix is placed in the first column vector precedes a location where the first sub-matrix is placed in the first row vector. A location where the (1−a2)-th sub-matrix of the block matrix B is placed in the second column vector precedes a location where the first sub-matrix of the block matrix E is placed in the second row vector. The first sub-matrices are defined as a unit matrix having a size of Z×Z. Each of the (1−aj)-th sub-matrices is defined as a matrix obtained by performing a left-cyclic shift 'aj' times on the first sub-matrix. The masked (1−(aj+1))-th sub-matrix is defined as a matrix in which a first row is masked in a matrix obtained by performing a left-cyclic shift "aj+1" times on the first sub-matrix. The (1−(aj−2))-th sub-matrix is defined as a matrix obtained by performing a left-cyclic shift "aj−2" times on the first sub-matrix.

According to an embodiment, a semiconductor device may include an ECC encoder configured to generate an encoded codeword including an information bit and a parity bit based on a parity check matrix. The ECC encoder may include a bit accumulator that generates an intermediate bit by performing an operation of multiplying a lower triangular matrix by an input bit, and a first shifter that generates the parity bit by performing an operation of multiplying a (1-(Z-ai))-th sub-matrix by the intermediate bit.

BRIEF DESCRIPTION OF THE FIGURES

The above and other objects and features of the present disclosure will become apparent by describing in detail embodiments thereof with reference to the accompanying drawings.

FIG. 14 is a diagram showing components of block matrix Bb of FIG. 12 according to example embodiments.

FIG. 15 is a diagram showing components of block matrix Eb of FIG. 12 according to example embodiments.

FIG. 16 is a diagram illustrating mapping data stored in a mapping table in a case of "Mb'=1" according to example embodiments.

FIG. 18 is a diagram showing an example of the base matrix of FIG. 11 in a case of "Mb'≥2" according to example embodiments.

FIG. 21 is a diagram showing components of the block matrix Db of FIG. 19 according to example embodiments.

FIG. 22 is a diagram showing components of block matrix Bb of FIG. 19 according to example embodiments.

FIG. 23 is a diagram showing components of the block matrix Eb of FIG. 19 according to example embodiments.

FIG. 24 is a diagram illustrating mapping data stored in a mapping table in a case of "Mb'≥2" according to example embodiments.

DETAILED DESCRIPTION

Hereinafter, embodiments of the present disclosure may be described in detail and clearly to such an extent that an ordinary one in the art easily implements the present disclosure.

As used in this specification, the terms "device" or "unit" refer to software, firmware, and/or any combination of hardware configured to provide the functionality described in this specification. For example, the software may be implemented as a software package, codes and/or set of instructions, or instructions. For example, the hardware may include a single or any combination or assembly of firmware storing instructions executed by a hardwired circuit, a programmable circuit, a state machine circuit, and/or a programmable circuit.

Figure 1:
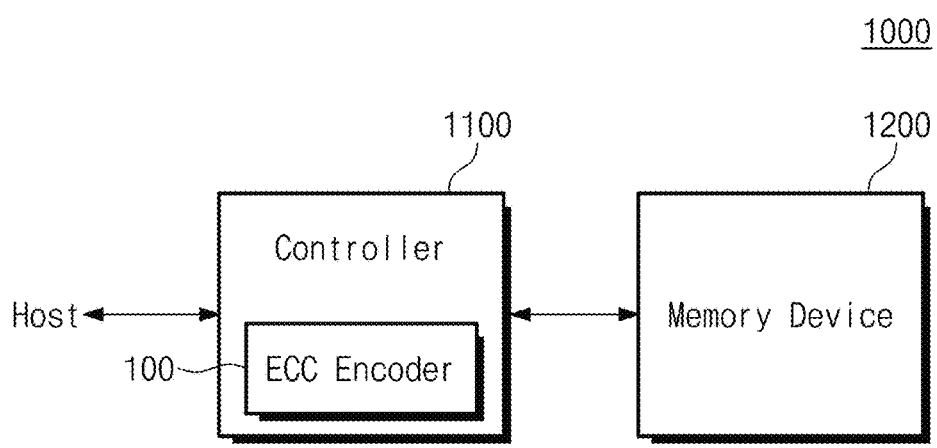
FIG. 1 is a diagram showing an example of a memory system including an ECC encoder, according to example embodiments.

FIG. 1 is a diagram showing an example of a memory system including an ECC encoder, according to example embodiments.

Referring to FIG. 1, a memory system 1000 includes a controller 1100 and a memory device 1200. The memory device 1200 includes a flash memory. The memory device 1200 is configured to store data by adjusting threshold voltages of memory cells. Herein, one of the memory system 1000, the controller 1100, and the memory device 1200 may be referred to as a semiconductor device.

The controller 1100 is connected to a host and the memory device 1200. The controller 1100 is configured to access the memory device 1200 in response to a request from the host. For example, the controller 1100 is configured to control a read operation, a write operation, an erase operation, and a background operation of the memory device 1200. The controller 1100 is configured to provide an interface between the memory device 1200 and the host. The controller 1100 is configured to drive firmware for controlling the memory device 1200.

For example, the controller 1100 is configured to provide control signals and addresses to the memory device 1200. Moreover, the controller 1100 is configured to exchange data with the memory device 1200.

The controller 1100 includes an ECC encoder 100. The ECC encoder 100 performs encoding using ECC on data provided from the host. For example, the controller 1100 may be configured to receive data in a form of a codeword from the host.

The ECC encoder 100 is configured to perform encoding on a codeword and to provide the encoded codeword to a memory device. The ECC encoder 100 performs encoding using an LDPC code.

The controller 1100 communicates with a host according to a specific communication standard. For example, the controller 1100 may communicate with the host through at least one of various communication protocols such as, but not limited to, universal serial bus (USB), multimedia card (MMC), peripheral component interconnection (PCI), PCI-express (PCI-E), advanced technology attachment (ATA), Serial-ATA, Parallel-ATA, a small computer small interface (SCSI), an enhanced small disk interface (ESDI), integrated drive electronics (IDE), and Firewire.

The controller 1100 and the memory device 1200 may be integrated in a single semiconductor device. For example, the controller 1100 and the memory device 1200 are integrated in a single semiconductor device to form a solid state drive (SSD). The controller 110 and the memory device 1200 may be integrated in a single semiconductor device to form a memory card. For example, the controller 1100 and the memory device 1200 are integrated in a single semiconductor device to form a memory card such as, but not limited to, a PC card (a personal computer memory card international association (PCMCIA) card), a compact flash card (CF), a smart media card (SM, SMC), a memory stick, a multimedia card (MMC, RS-MMC, or MMCmicro), an SD card (SD, miniSD, microSD, or SDHC), and universal flash storage (UFS).

For another example, the memory system 1000 forms a ultra-mobile PC (UMPC), a workstation, a net-book, personal digital assistants (PDA), a portable computer, a web tablet, a tablet computer, a wireless phone, a mobile phone, a smartphone, e-book, a portable multimedia player (PMP), a portable game player, a navigation device, a black box, a digital camera, a digital multimedia broadcasting (DMB) player, a 3-dimensional television, a digital audio recorder, a digital audio player, digital video recorder (digital picture Recorder), a digital picture player, a digital video recorder, a digital video player, storage devices constituting a data center, a device which sends and receives information in a wireless environment, one of various electronic devices constituting a home network, one of various electronic devices constituting a computer network, one of various electronic devices constituting a telematics network, an RFID device, or one of various components constituting a computing system.

For example, the memory device 1200 or the memory system 1000 may be packaged according to any of a variety of different packaging technologies. For example, the memory device 1200 or the memory system 1000 may be packaged according to any of such packaging technologies including the following: package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

Figure 2:
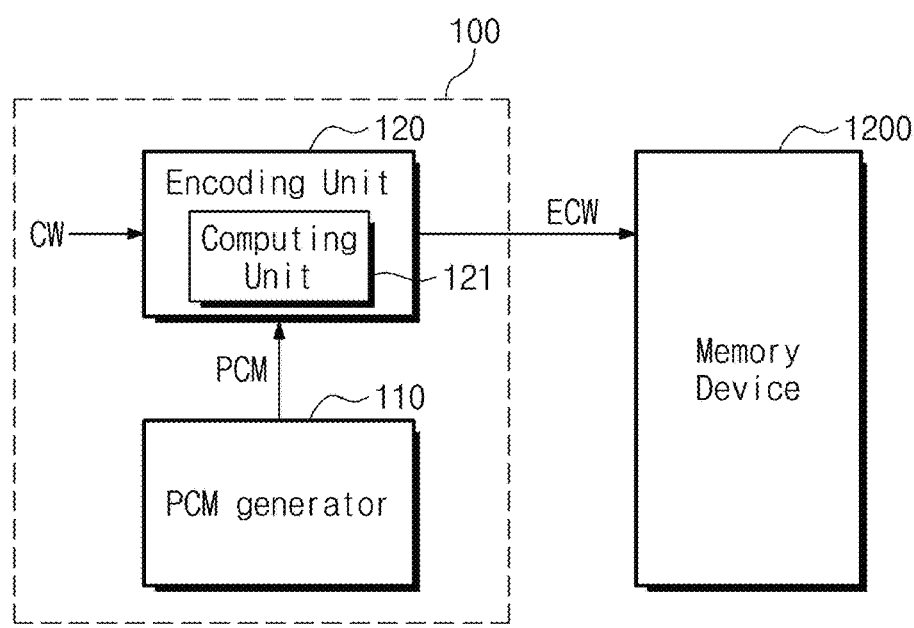
FIG. 2 is a block diagram illustrating an embodiment of the ECC encoder of FIG. 1 according to example embodiments.

FIG. 2 is a block diagram illustrating an embodiment of the ECC encoder of FIG. 1 according to example embodiments.

Referring to FIG. 2, the ECC encoder 100 may be configured to encode a codeword CW based on a parity check matrix PCM and then may generate the encoded codeword ECW.

The codeword CW received by the ECC encoder 100 may include information bits. The encoded codeword ECW may include information bits and parity bits, and may be expressed as in Equation 1 below.

$$ECW = \begin{bmatrix} s \\ p \end{bmatrix} \qquad \text{[Equation 1]}$$

In Equation 1, 's' denotes an information bit and 'p' denotes a parity bit. Each of the information bit and parity bit may be expressed in a vector format including a plurality of bits. In other words, the encoded codeword ECW may include an information bit composed of a plurality of bits and a parity bit composed of a plurality of bits.

The ECC encoder 100 may include a parity check matrix (PCM) generator 110 and an encoding unit 120.

The PCM generator 110 may be configured to generate a parity check matrix PCM. The parity check matrix PCM may be a low-density parity check (LDPC) code composed of components of '1' or '0'.

The parity check matrix PCM may be expressed as Equation 2 below.

$$H = [\,Hinfo \ \ Hpar\,] = \begin{bmatrix} A & B & T \\ C & D & E \end{bmatrix} \qquad \text{[Equation 2]}$$

In Equation 2, 'H' denotes the parity check matrix PCM. As in Equation 2, the parity check matrix PCM may be divided into an information part Hinfo and a parity part Hpar. The information part Hinfo may include block matrix A and block matrix C. The parity part Hpar may include block matrix B, block matrix T, block matrix D, and block matrix E. A detailed arrangement of the parity check matrix PCM will be described later with reference to FIGS. 4 to 8.

The encoding unit 120 may be configured to generate the encoded codeword ECW including parity bits based on the parity check matrix PCM. In other words, the encoding unit 120 may be configured to calculate parity bits based on the parity check matrix PCM and information bits.

The relationship between the parity check matrix PCM and the encoded codeword ECW may be expressed in Equation 3 below.

$$H \cdot ECW = [\,Hinfo \ \ Hpar\,]\begin{bmatrix} s \\ p \end{bmatrix} = Hinfo \cdot s + Hpar \cdot p = 0 \qquad \text{[Equation 3]}$$

As in Equation 3, the information part Hinfo of the parity check matrix PCM may be operated with information bit(s), and the parity part Hpar may be operated with parity bit (p).

The encoding unit 120 may be configured to perform an operation for calculating a parity bit. An operation for calculating the parity bit may be expressed as in Equation 4 below.

$$p = Hpar^{-1}(Hinfo \cdot s) \qquad \text{[Equation 4]}$$

The parity bit may include a first parity bit and a second parity bit. The first parity bit may be operated with block matrix B and/or block matrix D of the parity part. The second parity bit may be operated with block matrix T and/or block matrix E of the parity part.

The encoding unit 120 may include a computing unit 121. The computing unit 121 is configured to calculate a first parity bit based on Equation 4.

In this specification, components of all matrices or all sub-matrices are '1' or '0', and an operation of '+' (or sum operation) between all matrices or all sub-matrices may mean an XOR operation. For example, when components of '1', of which the number is an even number, are added by the operation of '+' (or sum operation), the result of the XOR operation becomes '0'. When components of '1', of which the number is an odd number, are added by the operation of '+', the result of the XOR operation becomes '1'.

A detailed configuration and operation method of the computing unit 121 will be described later with reference to FIGS. 26 to 31.

In the meantime, FIG. 2 illustrates that the PCM generator 110 is included in the ECC encoder 100. Unlike the illustration of FIG. 2, the PCM generator 110 may be provided outside the controller. For example, the PCM generator 110 may be included in a host. The host may generate the parity check matrix PCM and then may provide the parity check matrix PCM to the encoding unit 120 of the ECC encoder 100.

In an embodiment of the present disclosure, the parity check matrix PCM including the parity part Hpar designed to calculate parity bits with a small amount of computation is provided. Accordingly, the amount of computation required in the encoding unit 120 that encodes the codeword CW may be reduced.

In addition, in the case of the present disclosure, the encoding unit 120 having a structure capable of easily implementing an operation of calculating parity bits with hardware may be provided. A detailed configuration and operation of the encoding unit 120 will be described later with reference to FIGS. 26 to 31.

In an embodiment of the present disclosure, the parity part Hpar designed to simultaneously improve error floor characteristics and waterfall characteristics may be provided.

Figure 3:
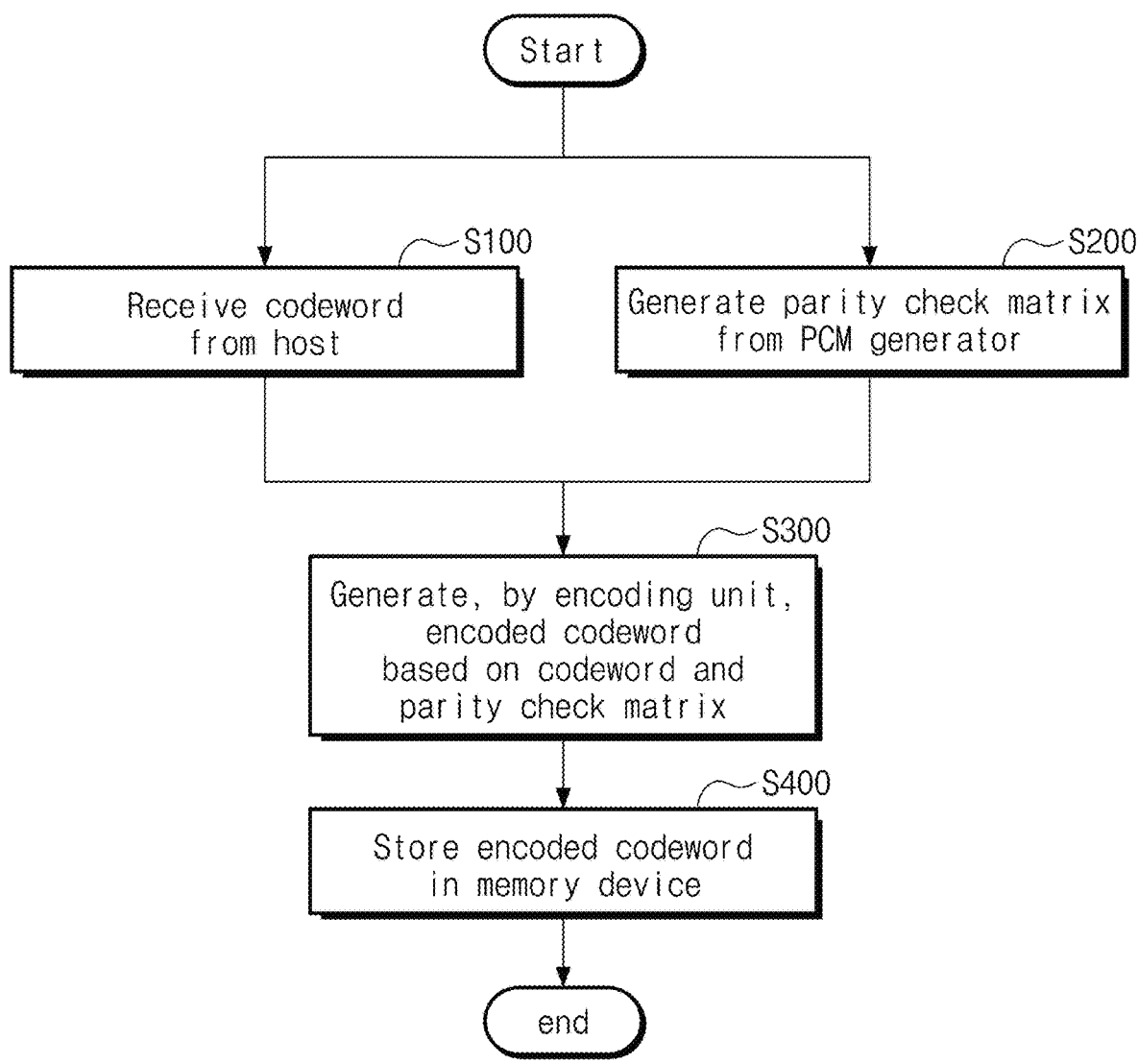
FIG. 3 is a flowchart illustrating an example of a method of operating the ECC encoder of FIG. 2 according to example embodiments.

FIG. 3 is a flowchart illustrating an example of a method of operating the ECC encoder of FIG. 2 according to example embodiments.

Referring to FIGS. 2 and 3, in operation S100, the encoding unit 120 may receive the codeword CW from a host. The codeword CW may include information bits.

In operation S200, the PCM generator 110 may generate the parity check matrix PCM. The parity check matrix PCM may be a low-density parity check code composed of components of '1' or '0'.

In operation S300, the encoding unit 120 may generate the encoded codeword ECW obtained by encoding the codeword CW by using the parity check matrix PCM. The encoded codeword ECW may include information bits and parity bits.

In operation S400, the encoding unit 120 may provide the encoded codeword ECW to a memory device. The memory device may store the encoded codeword ECW.

Figure 4:
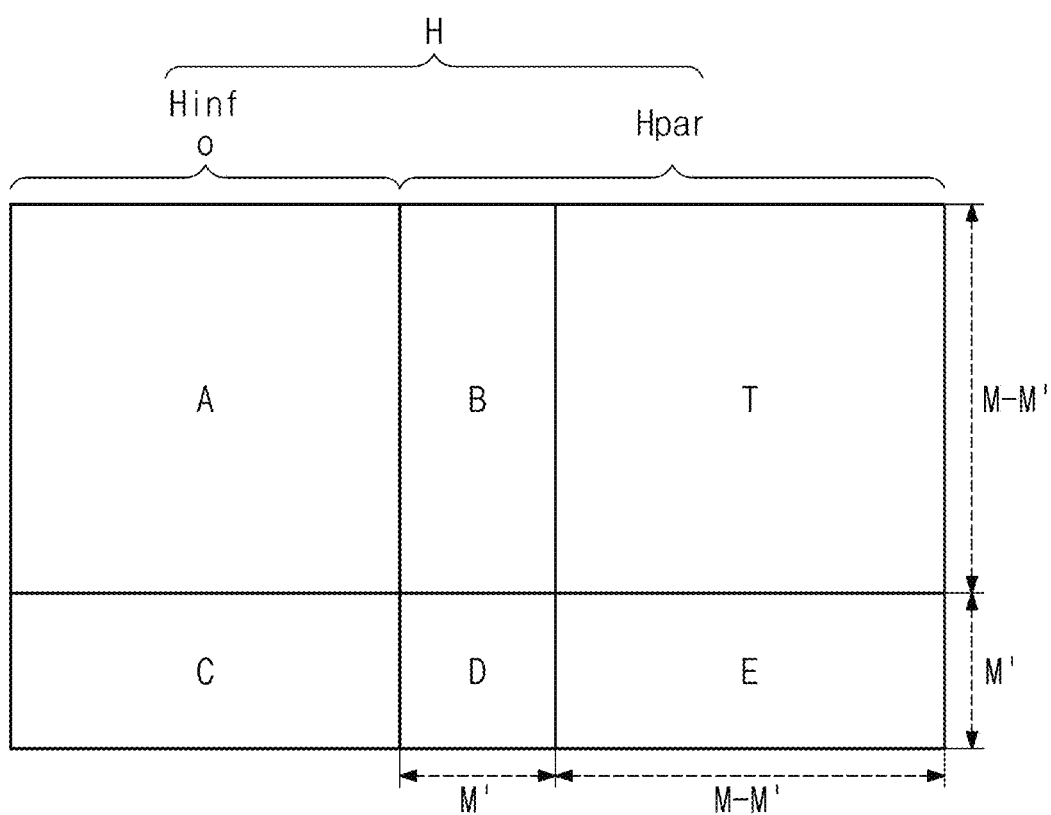
FIG. 4 is a diagram showing an example of a parity check matrix generated by the PCM generator of FIG. 2 according to example embodiments.

FIG. 4 is a diagram showing an example of a parity check matrix generated by the PCM generator of FIG. 2 according to example embodiments.

Referring to FIG. 4, a parity check matrix may include block matrix A, block matrix B, block matrix T, block matrix C, block matrix D, and block matrix E.

In the parity check matrix PCM, block matrix A and block matrix C may be classified as the information part Hinfo, and block matrix B, block matrix T, block matrix D, and block matrix E may be classified as the parity part Hpar. Referring to Equation 3, block matrix A and block matrix C of the information part Hinfo may be operated with information bit(s), and block matrix B, block matrix T, block matrix D and block matrix E of the parity part Hpar may be operated with parity bit (p). The present disclosure relates to the parity part Hpar of the parity check matrix PCM, and the parity part Hpar will be described in detail below.

The parity part Hpar may be M×M matrix ('M' is a natural number). 'M' may have sub-row or sub-column units. In other words, the parity part Hpar may be a matrix identified by 'M' sub-rows and 'M' sub-columns. A sub-matrix may be arranged at a location where sub-rows respectively intersect sub-columns.

In this specification, a 0-th sub-matrix SM0, a first sub-matrix SM1, a (1−a)-th sub-matrix SM1_a, and the masked (1−a)-th sub-matrix MSM1_a may be defined as a sub-matrix.

In this specification, the 0-th sub-matrix SM0 may be defined as a zero matrix having Z×Z ('Z' is a natural number), and may be expressed as in Equation 5 below.

$$SM0 = \left.\begin{bmatrix} \overbrace{0 & 0 & 0 & & 0}^{Z} \\ 0 & 0 & 0 & \cdots & 0 \\ 0 & 0 & 0 & & 0 \\ \vdots & & & \ddots & 0 \\ 0 & 0 & 0 & 0 & 0 \end{bmatrix}\right\}Z \qquad \text{[Equation 5]}$$

In this specification, the first sub-matrix may be defined as a unit matrix having Z×Z ('Z' is a natural number), and may be expressed as in Equation 6 below.

$$SM1 = \left.\begin{bmatrix} \overbrace{1 & 0 & 0 & & 0}^{Z} \\ 0 & 1 & 0 & \cdots & 0 \\ 0 & 0 & 1 & & 0 \\ \vdots & & & \ddots & 0 \\ 0 & 0 & 0 & 0 & 1 \end{bmatrix}\right\}Z \qquad \text{[Equation 6]}$$

In this specification, the (1−a)-th sub-matrix is defined as a matrix obtained by performing a left-cyclic shift 'a' times on the first sub-matrix, and may be expressed as in Equation 7 below.

$$SM1\_a = \left.\begin{matrix} a\left\{\vphantom{\begin{matrix}0\\0\end{matrix}}\right. \\ Z-a\left\{\vphantom{\begin{matrix}0\\0\\0\end{matrix}}\right. \end{matrix}\underbrace{\begin{bmatrix} 0 & & 0 & 1 \\ \vdots & & 0 & 0 & \ddots \\ 1 & & 0 & 0 \\ & \ddots & & \vdots \\ 0 & 0 & 1 & 0 \end{bmatrix}}_{\substack{Z-a \quad a}} \qquad \text{[Equation 7]}$$

In Equation 7, 'a' may be a natural number greater than or equal to '1' and less than or equal to 'Z'. That is, the (1-a)-th sub-matrix may be a quasi-cyclic matrix.

In this specification, the masked (1-a)-th sub-matrix is defined as a matrix in which a first row is masked in the (1-a)-th sub-matrix, and may be expressed as in Equation 8 below.

$$MSM1\_a = \begin{matrix} a\{ \\ \\ Z-a\{ \end{matrix} \begin{bmatrix} 0 & 0 & 0 \\ \vdots & 0 & 0 & \ddots \\ 1 & & 0 & 0 \\ & \ddots & & \vdots \\ 0 & 0 & 1 & 0 \\ \underbrace{\phantom{0\ 0\ 1\ 0}}_{Z-a} & \underbrace{\phantom{0}}_{a} \end{bmatrix}$$ [Equation 8]

In this specification, as in Equation 8, masking the first row in the sub-matrix means setting all components of the first row of a matrix to 0.

The parity part Hpar may be divided into block matrix B, block matrix T, block matrix D and block matrix E. Block matrix B and block matrix T may be arranged in the same sub-rows of the parity part Hpar, and block matrix D and block matrix E may be arranged on the same sub-rows thereof. Block matrix B and block matrix D may be arranged in the same sub-columns of the parity part Hpar, and block matrix T and block matrix E may be arranged on the same sub-columns thereof.

Block matrix B may be a matrix having a size of (M-M')× M'. M' may be a number smaller than M. In other words, block matrix B may be composed of (M-M')×M' sub-matrices.

Block matrix T may be a matrix having a size of (M-M')× (M-M'). In other words, block matrix T may be composed of (M-M')×(M-M') sub-matrices. Block matrix T may include a plurality of first sub-matrices arranged in a dual diagonal structure.

Block matrix D may be a matrix having a size of M'×M'. In other words, block matrix D may be composed of M'×M' sub-matrices. For example, when M' is 1, block matrix D may be composed of one sub-matrix (a first sub-matrix). When M' is 2, block matrix D may be composed of four sub-matrices.

Block matrix E may be a matrix having a size of M'×(M-M'). In other words, block matrix E may be composed of M'×(M-M') sub-matrices.

In an embodiment, when M' is 1, block matrix B may include a first sub-matrix and a (1-a)-th sub-matrix, and block matrix E may include a first sub-matrix and a masked (1-(a+1))-th sub-matrix. A location where the first sub-matrix is placed in block matrix B may precede a location where the masked (1-(a+1))-th sub-matrix is placed in block matrix E. A location where the (1-a)-th sub-matrix is placed in block matrix B may precede a location where the first sub-matrix is placed in block matrix E.

In an embodiment of the present disclosure, a detailed arrangement of the parity part Hpar in the case where M' is 1 will be described later through FIGS. 5 and 6.

In another embodiment, when M'≥2, block matrix B may include first to M'-th column vectors. An i-th column vector ('i' is a natural number greater than or equal to 1 and less than or equal to M') may include a (1-ai)-th sub-matrix (ai is one of a1, a2, . . . , and aM', and a1, a2, . . . , and aM' are independent integers greater than or equal to 0) and a plurality of 0-th sub-matrices. Block matrix E may include first to M'-th row vectors. Each row vector may include a first sub-matrix and a plurality of 0-th sub-matrices. A location where a (1-a1)-th sub-matrix is placed in a first column vector of block matrix B may precede a location where the first sub-matrix is placed in a first row vector of block matrix E. A location where a (1-a2)-th sub-matrix is placed in a second column vector of block matrix B may precede a location where the first sub-matrix is placed in a second row vector of block matrix E. In block matrix D, the masked (1-(a1+1))-th sub-matrix and (1-(a1-2))-th sub-matrix may be placed in the same sub-column as the first column vector. In block matrix D, the masked (1-(a2+1))-th sub-matrix and 0-th sub-matrix may be placed in the same sub-column as the second column vector.

In an embodiment of the present disclosure, when M'≥2, a detailed arrangement of the parity part Hpar will be described later through FIGS. 7 and 8.

The parity part Hpar may be a matrix identified by a plurality of rows and a plurality of columns. Each of the rows may correspond to a check node. Each of the columns may correspond to a variable node. Component of '1' or '0' may be positioned at locations where rows respectively intersect columns. That is, the parity check matrix PCM may be a LDPC matrix.

In this specification, a weight of each variable node may be defined as the number of 1s arranged in the column corresponding to the variable node. For example, when the number of '1's arranged in the first column is 3, the weight of the first variable node is 3. When the number of '1's arranged in the fourth column is 2, the weight of the fourth variable node is 2.

In an embodiment, the parity part Hpar may include variable nodes having a weight of 3. In an embodiment, the weight of at least one of variable nodes divided into block matrix B and block matrix D may be 3. The weight of at least one of variable nodes divided into block matrix T and block matrix E may be 3. In an embodiment, the weight of the remaining variable nodes other than variable nodes whose weight is 3 may be 2 or 1.

To have good waterfall characteristics, it is desirable that the parity check matrix PCM consists of variable nodes whose weight is 2. In this case, error floor characteristics may deteriorate. The error floor characteristic means that the error rate reduction rate decreases at a specific level of a signal-to-noise ratio (SNR). The deterioration of the error floor characteristic means that an error rate reduction rate is degraded at low SNR.

In an embodiment of the present disclosure, at least two variable nodes with a weight of 3 may be included in the parity part Hpar. Accordingly, in a case of the present disclosure, as compared to a case where all the weights of the parity part Hpar are 2, the error floor characteristic of the parity check matrix PCM may be improved, and may have a high waterfall characteristic at the same time.

Figure 5:
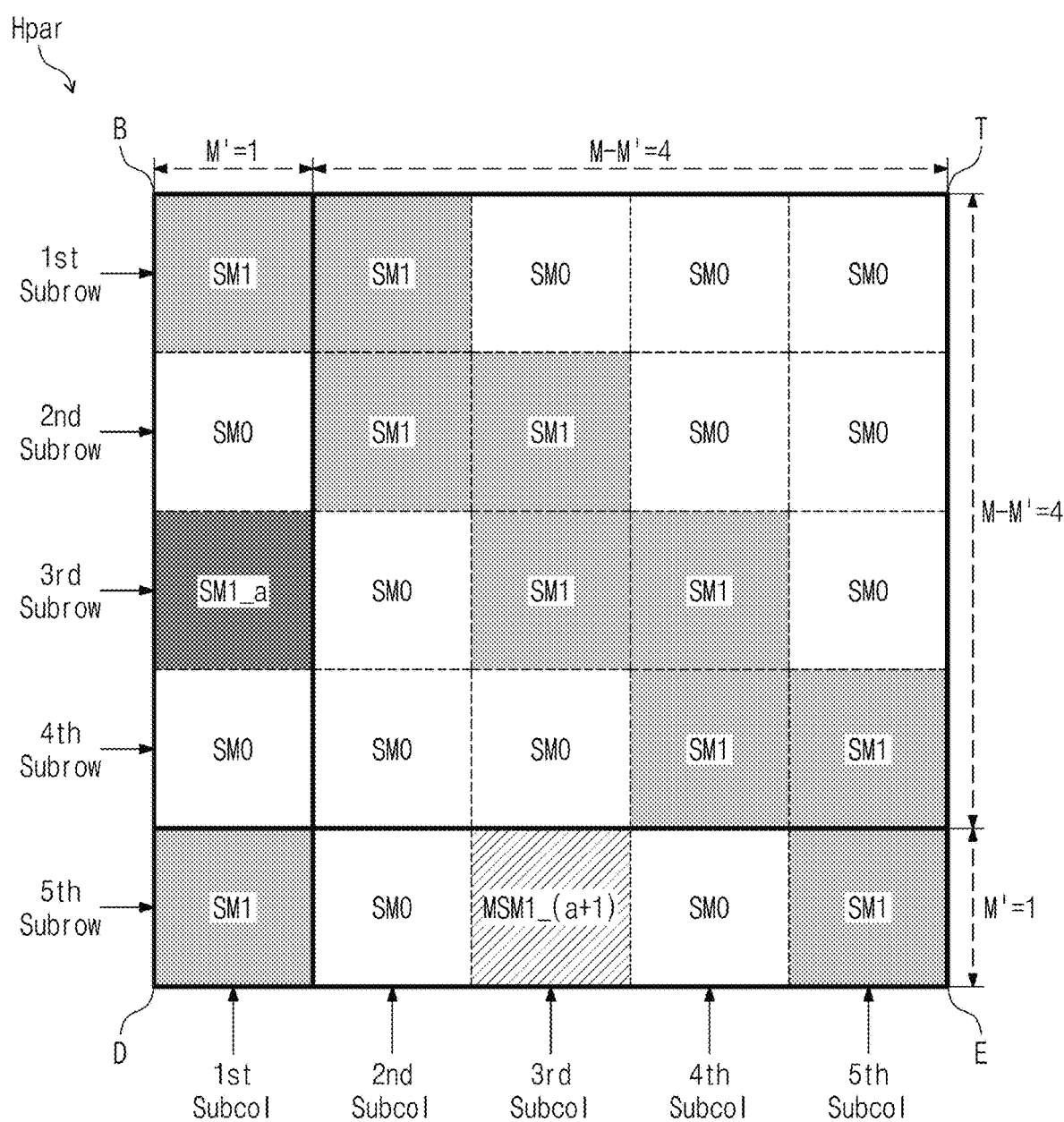
FIG. 5 is a diagram illustrating an example of the parity part of FIG. 4 in a case of "M'=1" according to example embodiments.

FIG. 5 is a diagram illustrating an example of the parity part of FIG. 4 in a case of "M'=1" according to example embodiments. FIG. 6 is a diagram showing components of the parity part of FIG. 5 according to example embodiments.

Referring to FIG. 5, in an embodiment, M' is 1 in the parity part Hpar. Hereinafter, an example of the parity part Hpar in the case that M is 5 will be described in detail.

The parity part Hpar may be identified by first to fifth sub-rows and first to fifth sub-columns.

Block matrix B may be arranged in first to fourth sub-rows and a first sub-column.

Block matrix B may include the first sub-matrix SM1, the (1-a)-th sub-matrix SM1_a, and the plurality of 0-th sub-matrices SM0. For example, in block matrix B, the first sub-matrix SM1 may be arranged in the first sub-row and first sub-column. For example, in block matrix B, the (1-a)-th sub-matrix SM1_a may be arranged in the third sub-row and the first sub-column. For example, the plurality of 0-th sub-matrices SM0 may be arranged at the remaining locations of block matrix B.

Block matrix T may be arranged in first to fourth sub-rows and second to fifth sub-columns. Block matrix T may include the plurality of first sub-matrices SM1 and the plurality of 0-th sub-matrices SM0. In block matrix T, the plurality of first sub-matrices SM1 may be arranged in a dual diagonal structure. The plurality of 0-th sub-matrices SM0 may be arranged at locations other than dual diagonal components in block matrix T.

Block matrix D may be arranged in the fifth sub-row and the first sub-column. Block matrix D may be composed of the first sub-matrix SM1. For example, the one first sub-matrix SM1 may be arranged in block matrix D.

Block matrix E may be arranged in the fifth sub-row and the second to fifth sub-columns. Block matrix E may include the first sub-matrix SM1, the masked (1-(a+1))-th sub-matrix MSM1_(a+1), and the plurality of 0-th sub-matrices SM0.

Locations of the first to fourth sub-rows in block matrix B may correspond to locations of second to fifth sub-columns in block matrix E. For example, a location of the first sub-row in block matrix B may correspond to a location of the second sub-column in block matrix E; a location of the second sub-row in block matrix B may correspond to a location of the third sub-column in block matrix E; a location of the third sub-row in block matrix B may correspond to a location of the fourth sub-column in block matrix E; and a location of the fourth sub-row in block matrix B may correspond to a location of the fifth sub-column in block matrix E.

In an embodiment, a location where the first sub-matrix SM1 is placed in block matrix B may precede a location where the (1-(a+1))-th sub-matrix (MSM1_(a+1)) masked in the block matrix E is placed. For example, when the first sub-matrix SM1 is located in the first sub-row in block matrix B, the (1-(a+1))-th sub-matrix (MSM1_(a+1)) masked in block matrix E may be placed in one of third to fifth sub-columns. For example, the (1-(a+1))-th sub-matrix (MSM1_(a+1)) masked in block matrix E may not be placed in the second sub-column.

In an embodiment, a location where the (1-a)-th sub-matrix SM1_a is placed in block matrix B may precede a location where the first sub-matrix SM1 is placed in block matrix E. For example, when the (1-a)-th sub-matrix SM1_a is located in the third sub-row in block matrix B, the first sub-matrix SM1 may be placed in the fifth sub-column in block matrix E. For example, the first sub-matrix SM1 may not be placed in the second to fourth sub-columns in block matrix E.

Figure 6:
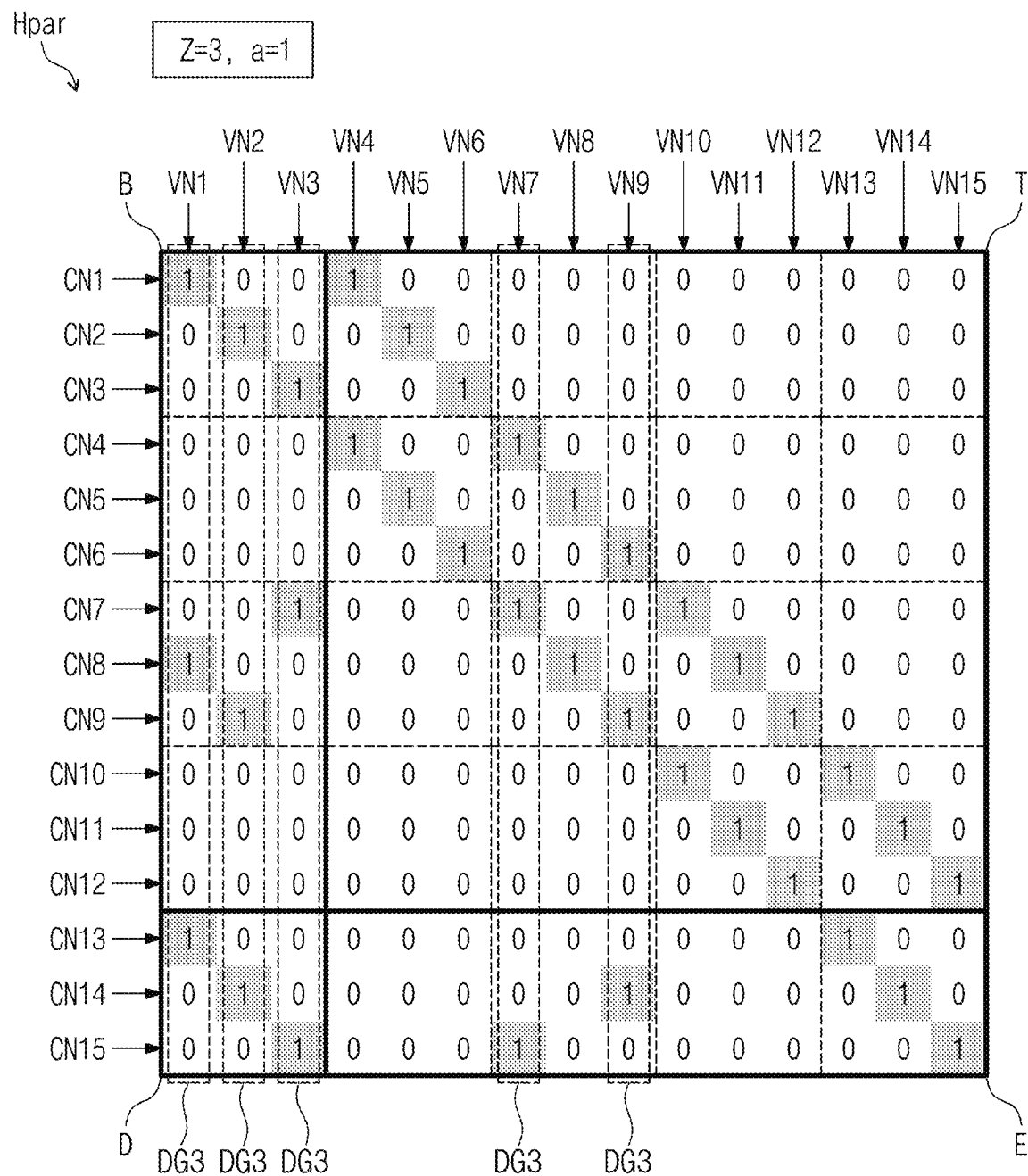
FIG. 6 is a diagram showing components of the parity part of FIG. 5 according to example embodiments.

Referring to FIG. 6, it may be assumed that Z is 3 and 'a' is 1 in the parity part Hpar.

The parity part Hpar may be a matrix identified by first to fifteenth rows and first to fifteenth columns. For example, the first to fifteenth rows may correspond to first to fifteenth check nodes CN1 to CN15, respectively. The first to fifteenth columns may correspond to first to fifteenth variable nodes VN1 to VN15, respectively.

In an embodiment, the parity part Hpar may include variable nodes DG3 whose weight is 3. In an embodiment, among variable nodes divided into block matrix B and block matrix D, each of a first variable node VN1, a second variable node VN2, and a third variable node VN3 may have a weight of 3. Among the variable nodes divided into block matrix T and block matrix E, each of a seventh variable node VN7 and a ninth variable node VN9 may have a weight of 3. In an embodiment, the weight of the remaining variable nodes other than the variable nodes DG3 whose weight is 3 may be 2.

Figure 7:
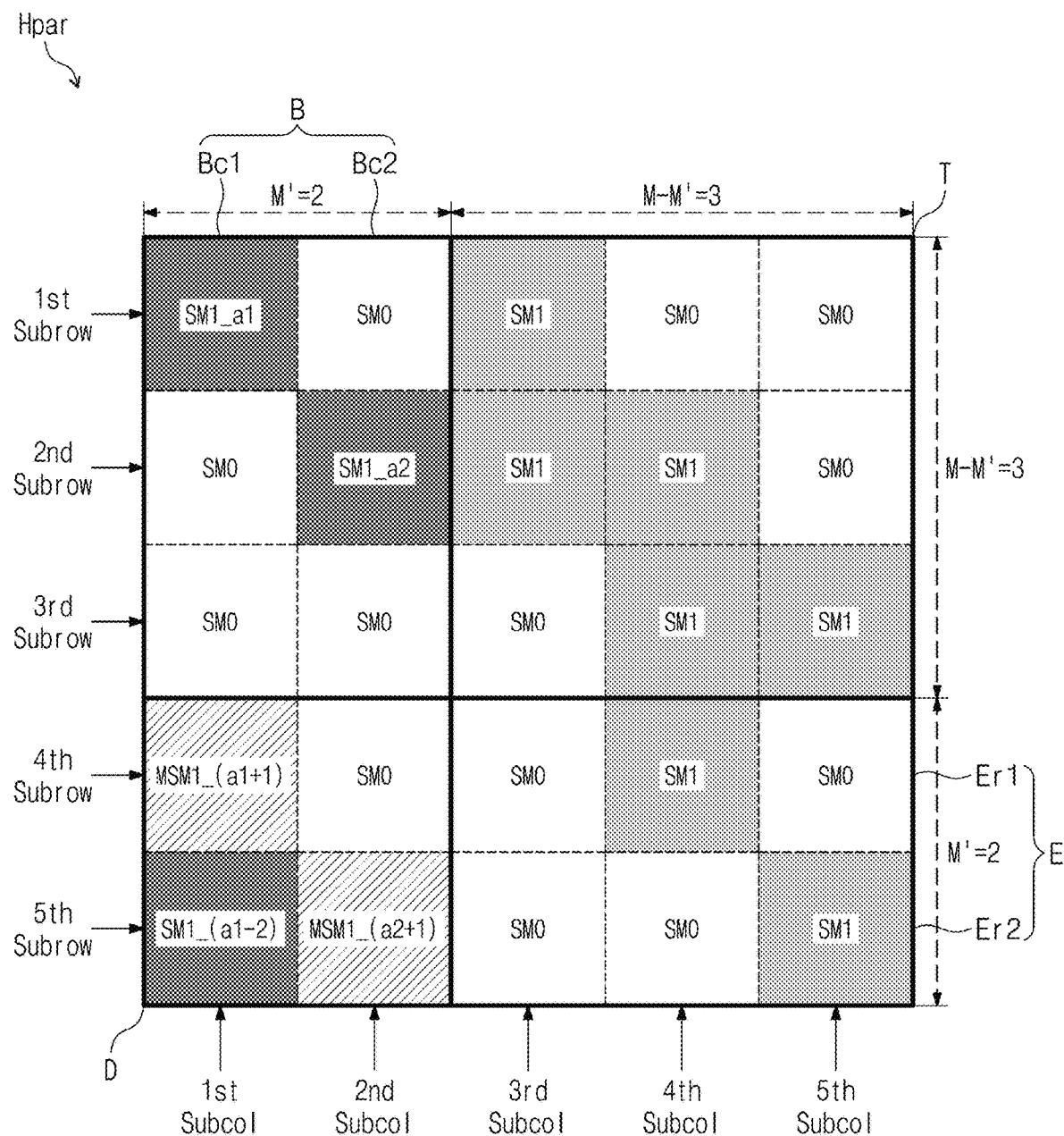
FIG. 7 is a diagram showing an example of the parity part of FIG. 4 in a case of "M'=2" according to example embodiments.

FIG. 7 is a diagram showing an example of the parity part of FIG. 4 in a case of "M'=2" according to example embodiments. FIG. 8 is a diagram showing components of the parity part of FIG. 7 according to example embodiments.

Referring to FIG. 7, in an embodiment, M' is 2 in the parity part Hpar. Hereinafter, an example of the parity part Hpar in the case that M is 5 will be described in detail.

The parity part Hpar may be identified by first to fifth sub-rows and first to fifth sub-rows.

Block matrix B may be arranged in the first to third sub-rows and the first and second sub-columns. Block matrix B may include first and second column vectors Bc1 and Bc2. The first column vector Bc1 may be placed in the first sub-column. The second column vector Bc2 may be placed in the second sub-column. The first column vector Bc1 may include the (1-a1)-th sub-matrix SM1_a1 and the plurality of 0-th sub-matrices SM0. For example, in the first column vector Bc1, the (1-a1)-th sub-matrix SM1_a1 may be arranged in the first sub-row and the first sub-column. For example, the plurality of 0-th sub-matrices SM0 may be arranged at the remaining locations in the first column vector Bc1. The second column vector Bc2 may include the (1-a2)-th sub-matrix SM1_a2 and the plurality of 0-th sub-matrices SM0. For example, in the second column vector Bc2, the (1-a2)-th sub-matrix SM1_a2 may be arranged in the second sub-row and the second sub-column. For example, in the second column vector Bc2, the plurality of 0-th sub-matrices SM0 may be arranged at the remaining locations. In an embodiment, a1 and a2 may have values independent of each other. For example, a1 and a2 may have values the same as or different from each other.

Block matrix T may be arranged in the first to third sub-rows and the third to fifth sub-columns. Block matrix T may include the plurality of first sub-matrices SM1 and the plurality of 0-th sub-matrices SM0. In block matrix T, the plurality of first sub-matrices SM1 may be arranged in a dual diagonal structure. The plurality of 0-th sub-matrices SM0 may be arranged at locations other than dual diagonal components in block matrix T.

Block matrix D may be arranged in the fourth and fifth sub-rows and the first and second sub-columns. Block matrix D may include sub-matrices arranged in a dual diagonal structure. The (1-(a1+1))-th sub-matrix MSM1_(a1+1) masked in the same sub-column (the first sub-column) as the first column vector Bc1, and a (1-(a1-2))-th sub-matrix may be arranged in block matrix D. The (1-(a2+1))-th sub-matrix (MSM1_(a2+1)) masked in the same sub-column as the second column vector Bc2, and the 0-th sub-matrix SM0 may be placed in block matrix D.

Block matrix E may be arranged in the fourth and fifth sub-rows and the third to fifth sub-columns. Block matrix E may include first and second row vectors Er1 and Er2. Each of the row vectors may include the first sub-matrix SM1 and the plurality of 0-th sub-matrices SM0.

Locations of the first to third sub-rows in block matrix B may correspond to locations of the third to fifth sub-columns in block matrix E. For example, a location of the first sub-row in block matrix B may correspond to a location of the third sub-column in block matrix E; a location of the second sub-row in block matrix B may correspond to a location of the fourth sub-column in block matrix E; and a location of the third sub-row in block matrix B may correspond to a location of the fifth sub-column in block matrix E.

In an embodiment, a location where the (1−a1)-th sub-matrix SM1_a1 is placed in the first column vector Bc1 of block matrix B may precede a location where the first sub-matrix SM1 is placed in the first row vector Er1 of block matrix E. For example, when the (1−a1)-th sub-matrix SM1_a1 in the first column vector Bc1 is located in the first sub-row, the first sub-matrix SM1 may be placed in one of the fourth and fifth sub-columns in the first row vector Er1. For example, in the first row vector Er1, the first sub-matrix SM1 may not be placed in the third sub-column.

In an embodiment, a location where the (1−a2)-th sub-matrix SM1_a2 is placed in the second column vector Bc2 of block matrix B may precede a location where the first sub-matrix SM1 is placed in the second row vector Er2 of block matrix E. For example, when the (1−a2)-th sub-matrix SM1_a2 in the second column vector Bc2 is located in the second sub-row, the first sub-matrix SM1 may be placed in the fifth sub-column in the second row vector Er2. For example, in the first row vector Er1, the first sub-matrix SM1 may not be placed in the third and fourth sub-columns.

Figure 8:
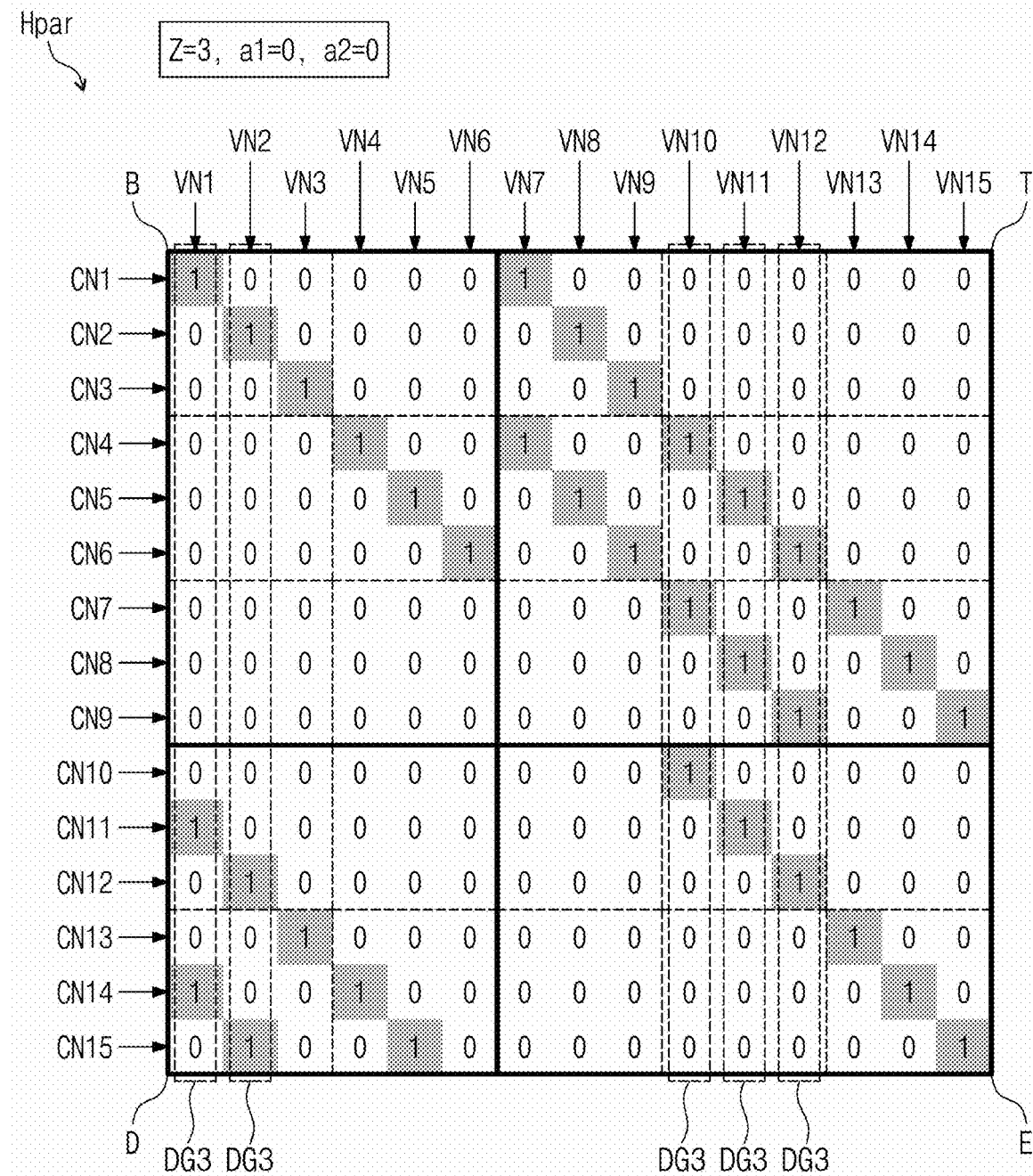
FIG. 8 is a diagram showing components of the parity part of FIG. 7 according to example embodiments.

Referring to FIG. 8, in the parity part Hpar, it may be assumed that Z is 3, and each of a1 and a2 is 0 (i.e., "a1=a2=0"). As described above, when M' is not less than 2, values of a1 to aM' may be set independently, and thus may be set to 0 (i.e., "a1=a2= . . . =aM'=0").

The parity part Hpar may be a matrix identified by first to fifteenth rows and first to fifteenth columns. For example, the first to fifteenth rows may correspond to first to fifteenth check nodes CN1 to CN15, respectively. The first to fifteenth columns may correspond to first to fifteenth variable nodes VN1 to VN15, respectively.

In an embodiment, the parity part Hpar may include variable nodes DG3 whose weight is 3. In an embodiment, among variable nodes divided into block matrix B and block matrix D, each of the first variable node VN1 and the second variable node VN2 may have a weight of 3. Among variable nodes divided into block matrix T and block matrix E, each of a tenth variable node VN10, an eleventh variable node VN11, and a twelfth variable node VN12 may have a weight of 3. In an embodiment, the weight of the remaining variable nodes other than the variable nodes DG3 whose weight is 3 may be 2 or 1.

Figure 9:
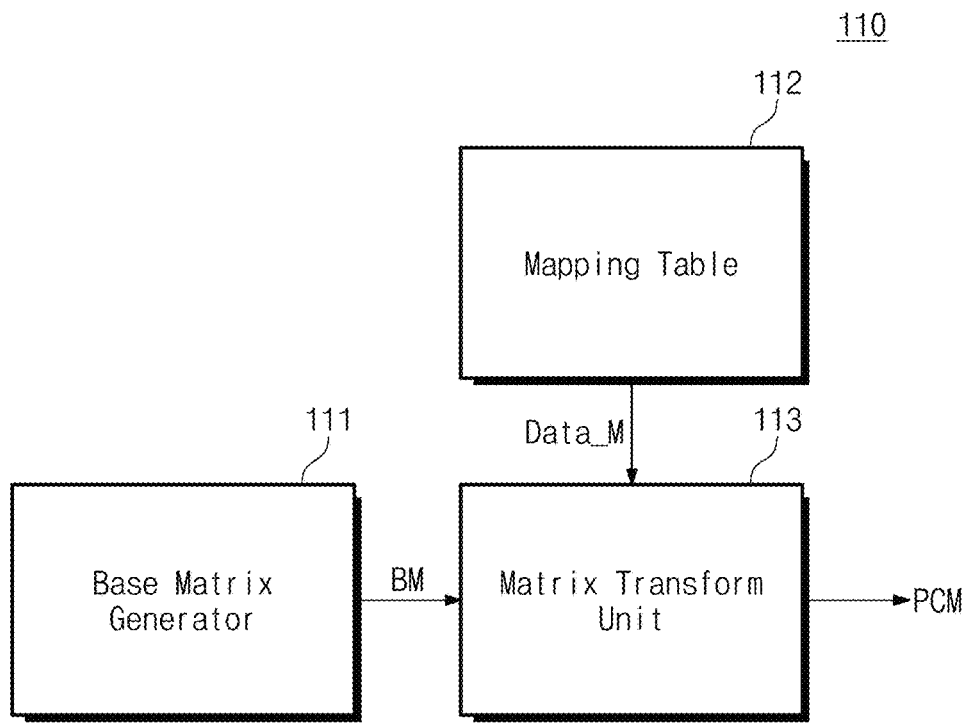
FIG. 9 is a block diagram showing an example of the PCM generator of FIG. 2 according to example embodiments.
Figure 10:
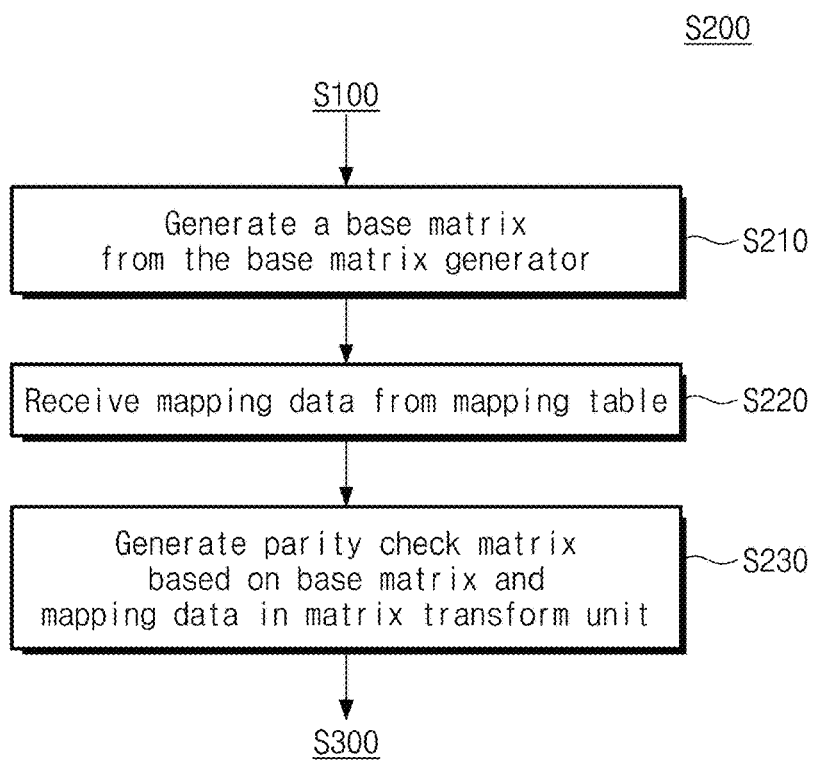
FIG. 10 is a flowchart illustrating an operating method of the PCM generator of FIG. 9 according to example embodiments.

FIG. 9 is a block diagram showing an example of the PCM generator of FIG. 2 according to example embodiments. FIG. 10 is a flowchart illustrating an operating method of the PCM generator of FIG. 9 according to example embodiments.

Referring to FIG. 9, the PCM generator 110 may include a base matrix generator 111, a mapping table 112 and a matrix transform unit 113. The PCM generator 110 may be configured to generate a parity check matrix PCM for encoding a codeword.

The base matrix generator 111 may be configured to generate base matrix BM for generating a parity part. Base matrix BM may include block matrix Bb, block matrix Tb, block matrix Db, and block matrix Eb corresponding to block matrix B, block matrix T, block matrix D, and block matrix E of the parity part Hpar. Each of block matrix Bb, block matrix Tb, block matrix Db, and block matrix Eb may be a matrix composed of components, each of which has '1' or '0'.

The mapping table 112 may be configured to store mapping data Data_M. The mapping data Data_M may include data for a sub-matrix in which components of '1' or '0' are to be substituted in block matrix Bb, block matrix Tb, block matrix Db, and block matrix Eb of the base matrix BM.

The matrix transform unit 113 is configured to generate a parity check matrix PCM including the parity part based on base matrix BM and the mapping data Data_M.

Referring to FIG. 10 together, in operation S210, the base matrix generator 111 may generate base matrix BM for generating a parity part. In operation S220, the matrix transform unit 113 may receive the mapping data Data_M from the mapping table 112. In operation S230, the matrix transform unit 113 may generate the parity check matrix PCM based on base matrix BM and the mapping data Data_M.

The transformation to the parity check matrix PCM by using the mapping data Data_M stored in the mapping table 112 will be described in detail with reference to FIGS. 11 to 25 below.

Figure 11:
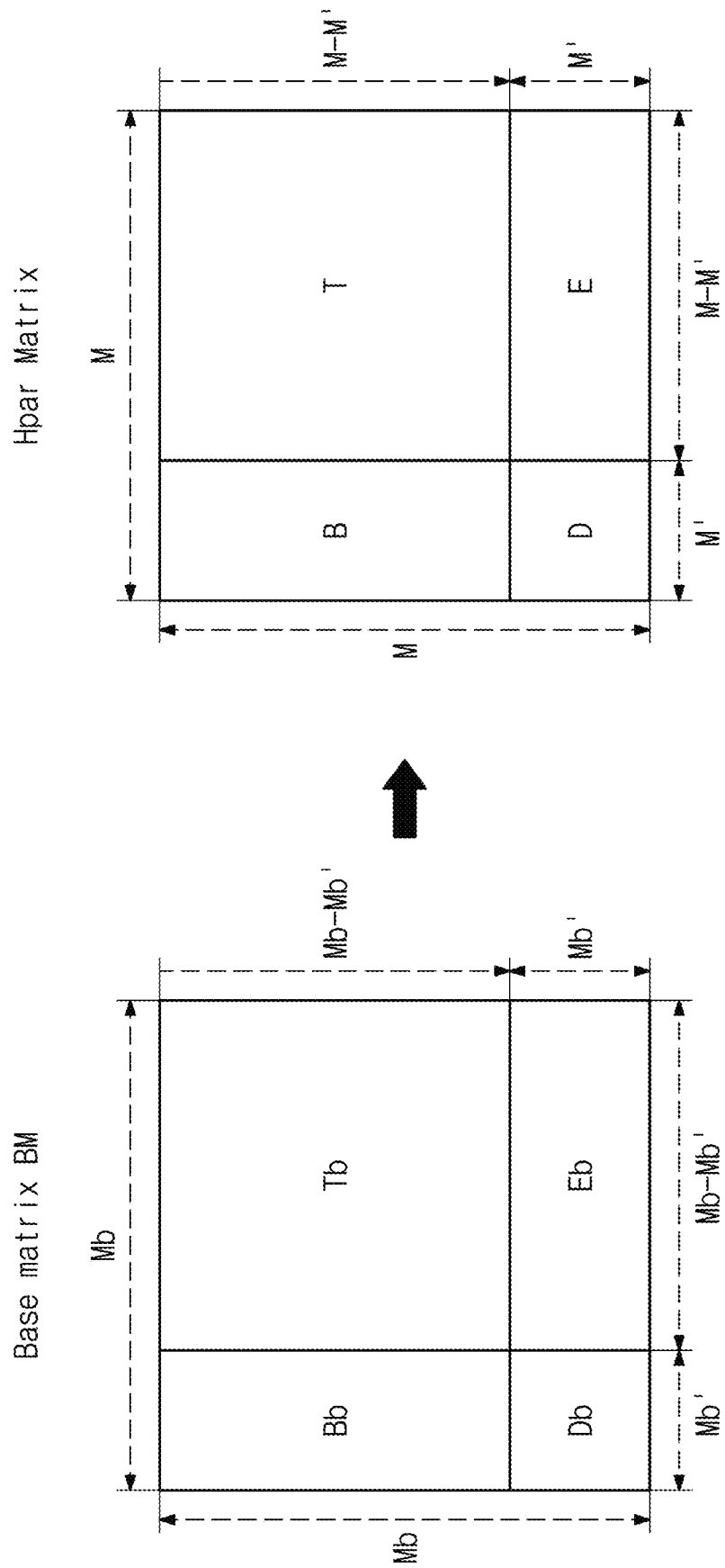
FIG. 11 is a diagram briefly illustrating transformation of a base matrix into a parity part of a parity check matrix, according to example embodiments.

FIG. 11 is a diagram briefly illustrating transformation of a base matrix into a parity part of a parity check matrix according to example embodiments.

Referring to FIG. 11, base matrix BM may be used to generate the parity part Hpar of the parity check matrix PCM.

Base matrix BM may be a matrix having a size of Mb×Mb (Mb is a natural number). For example, base matrix BM may be a matrix identified by Mb rows and Mb columns. Components of '1' or '0' may be arranged at locations where rows respectively intersect columns.

Base matrix BM may be divided into block matrix Bb, block matrix Tb, block matrix Db, and block matrix Eb. Block matrix Bb and block matrix Tb may be arranged in the same rows. Block matrix Db and block matrix Eb may be arranged in the same rows. Block matrix Bb and block matrix Db may be arranged in the same columns. Block matrix Tb and block matrix Eb may be arranged in the same columns.

Block matrix Bb may be a matrix having a size of (Mb-Mb')×Mb'. Mb' may be a number smaller than Mb. For example, block matrix Bb may be composed of (Mb-Mb')× Mb' components.

Block matrix Tb may be a matrix having a size of (Mb-Mb')×(Mb-Mb'). For example, block matrix Tb may be composed of (Mb-Mb')×(Mb-Mb') components.

Block matrix Db may be a matrix having a size of Mb'×Mb'. For example, block matrix Db may be composed of Mb'×Mb' components. For example, when Mb' is 1, block matrix Db may be composed of one component of '1'. When Mb' is 2, block matrix Db may be composed of four components.

Block matrix Eb may be a matrix having a size of Mb'×(Mb-Mb'). For example, block matrix Eb may be composed of Mb'×(Mb-Mb') components.

The weight of each column in base matrix BM may be defined as the number of '1's arranged in each column. For example, when the number of '1's arranged in the first column is 3, the weight of the first column is 3. When the number of '1's arranged in the fourth column is 2, the weight of the fourth column is 2.

In an embodiment, when Mb' is 1, the weight of the first column divided into block matrix Bb and block matrix Db may be 3, and the weight of at least one of columns divided into block matrix Tb and block matrix Eb may be 3. In an embodiment, the weight of the remaining columns other than the column whose weight is 3 may be 2. In an embodiment of the present disclosure, a specific arrangement of a base matrix in the case where Mb' is 1 will be described later through FIGS. 12 to 15.

In another embodiment, when Mb'≥2, the weight of at least one of columns divided into block matrix Bb and block matrix Db may be 3, and the weight of at least one of columns divided into block matrix Tb and block matrix Eb may be 3. In an embodiment, the weight of the remaining columns other than the column whose weight is 3 may be 2. In an embodiment of the present disclosure, a specific arrangement of a base matrix in the case of Mb'≥2 will be described later through FIGS. 18 to 25.

Figures 12, 13:
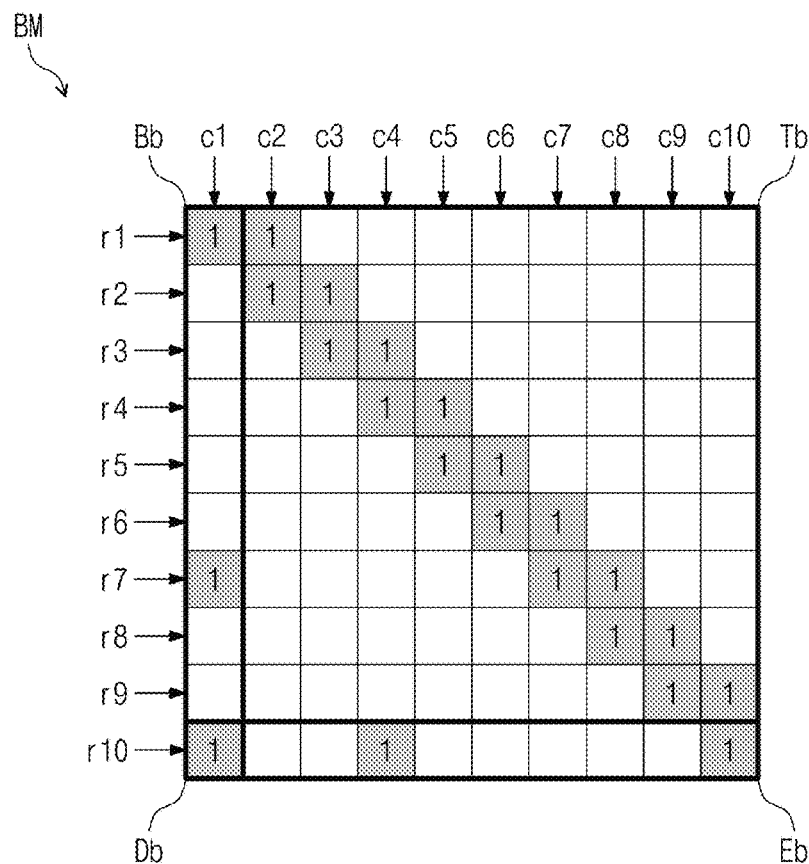
FIG. 12 is a diagram showing an example of the base matrix of FIG. 11 in a case of "Mb'=1", according to example embodiments.
FIG. 13 is a diagram showing components of block matrix Tb of FIG. 12, according to example embodiments.

FIG. 12 is a diagram showing an example of the base matrix of FIG. 11 in a case of "Mb'=1" according to example embodiments. FIG. 13 is a diagram showing components of block matrix Tb of FIG. 12 according to example embodiments. FIG. 14 is a diagram showing components of block matrix Bb of FIG. 12 according to example embodiments. FIG. 15 is a diagram showing components of block matrix Eb of FIG. 12 according to example embodiments.

Referring to FIG. 12, in an embodiment, Mb' is 1 in base matrix BM. Hereinafter, an example of base matrix BM in the case that Mb is 10 will be described in detail.

Base matrix BM may be divided into first to tenth rows r1 to r10 and first to tenth columns c1 to c10.

Block matrix Bb may be arranged in first to ninth rows (r1 to r9) and the first column c1. Block matrix Bb may include two components of '1' and a plurality of components of '0'. For example, in block matrix Bb, one component of '1' may be arranged in the first row r1 and the first column c1, and another component of '1' may be arranged in the seventh row r7 and the first column c1. In block matrix Bb, components of '0' may be arranged at the remaining locations.

Block matrix Tb may be arranged in the first to ninth rows r1 to r9 and the second to tenth columns c2 to c10. Block matrix Tb may include a plurality of components of '1' and a plurality of components of '0'. The plurality of components of '1' in block matrix Tb may be arranged in a dual diagonal structure. A plurality of components of '0' may be arranged at the remaining locations other than dual diagonal components in block matrix Tb.

Block matrix Db may be arranged in the tenth row r10 and the first column c1. Block matrix Db may be composed of one component of '1'.

Block matrix Eb may be arranged in the tenth row r10 and the second to tenth columns c2 to c10. Block matrix Eb may include two components of '1' and a plurality of components of '0'. For example, in block matrix Eb, one component of '1' may be arranged in the tenth row and the fourth column, and another component of '1' may be arranged in the tenth row and the tenth column. In block matrix Eb, components of '0' may be arranged at the remaining locations.

Referring to FIG. 13, components of block matrix Tb may be expressed as in Equation 9 below.

$$Tb\_i, j = \begin{cases} 1, & \text{if } j = i \text{ or } i = 1 \\ 0, & \text{else} \end{cases} \quad \text{[Equation 9]}$$

Referring to FIG. 13 and Equation 9, 'i' may denote a location of a row in block matrix Tb, and 'j' may denote a location of a column in block matrix Tb. For example, Tb_1,2 denotes an element located at (1, 2) in block matrix Tb. Hereinafter, in each of block matrix Bb and block matrix Eb, 'i' may denote a location of a row in a corresponding block matrix, and 'j' may denote a location of a column in the corresponding block matrix.

In this specification, in block matrix Bb, a k-th component of '1' ('k' is 1 or 2) may be defined. The first component of '1' refers to a component of '1' arranged to be high in block matrix Bb among the two components of '1' of block matrix Bb. The second component of '1' refers to a component of '1' arranged to be low in block matrix Bb among the two components of '1' of block matrix Bb.

In this specification, a location value (i(Bb, k)) of the k-th component of '1' ('k' is 1 or 2) in block matrix Bb may be defined. The location value (i(Bb, k)) of the k-th component of '1' may refer to value 'i' of the k-th component of '1'.

Referring to FIG. 14, for example, the first component of '1' refers to '1' located at 'i' ('i'=1) in block matrix Bb, and the second component of '1' refers to the component of '1' located at 'i' ('i'=7) in block matrix Bb. For example, in block matrix Bb, the location value (i(Bb, 1)) of the first component of '1' is 1, and the location value (i(Bb, 2)) of the second component of '1' is 7.

In this specification, in block matrix Eb, a k-th component of '1' ('k' is 1 or 2) may be defined. The first component of '1' refers to the component of '1' arranged to the left in block matrix Eb among the two components of '1' of block matrix Eb. The second component of '1' refers to the component of '1' arranged to the right in block matrix Eb among the two components of '1' of block matrix Bb.

In this specification, in block matrix Eb, a location value (j(Eb, k)) of the k-th component of '1' ('k' is 1 or 2) may be defined. The location value (j(Eb, k)) of the k-th component of '1' may refer to value 'j' of the k-th component of '1'.

Referring to FIG. 15 together, for example, the first component of '1' refers to '1' located at 'j' ('j'=3) in block matrix Eb, and the second component of '1' refers to the component of '1' located at 'j' ('j'=9) in block matrix Bb. For example, in block matrix Eb, a location value (j(Eb, 1)) of the first component of '1' is 3, and a location value (j(Eb, 2)) of the second component of '1' is 9.

In an embodiment, a location value of the first component of '1' in block matrix Bb may be smaller than a location value of first component of '1' in block matrix Eb. For example, when the first component of '1' is placed at 'i' ('i'=1) in block matrix Bb (see FIG. 14), the first component of '1' may be placed at 'j' ('j'=2, . . . , 9) in block matrix Eb (see FIG. 15). For example, in block matrix Eb, the first component of '1' may not be placed at 'j' ('j'=1).

In an embodiment, a location value of the second component of '1' in block matrix Bb may be smaller than a location value of second component of '1' in block matrix Eb. For example, when the second component of '1' is placed at 'i' ('i'=7) in block matrix Bb (see FIG. 14), the second component of '1' may be placed at 'j' ('j'=8, 9) in block matrix Eb (see FIG. 15). For example, in block matrix Eb, the second component of '1' may not be placed at 'j' ('j'=1, . . . , 7).

Figure 17:
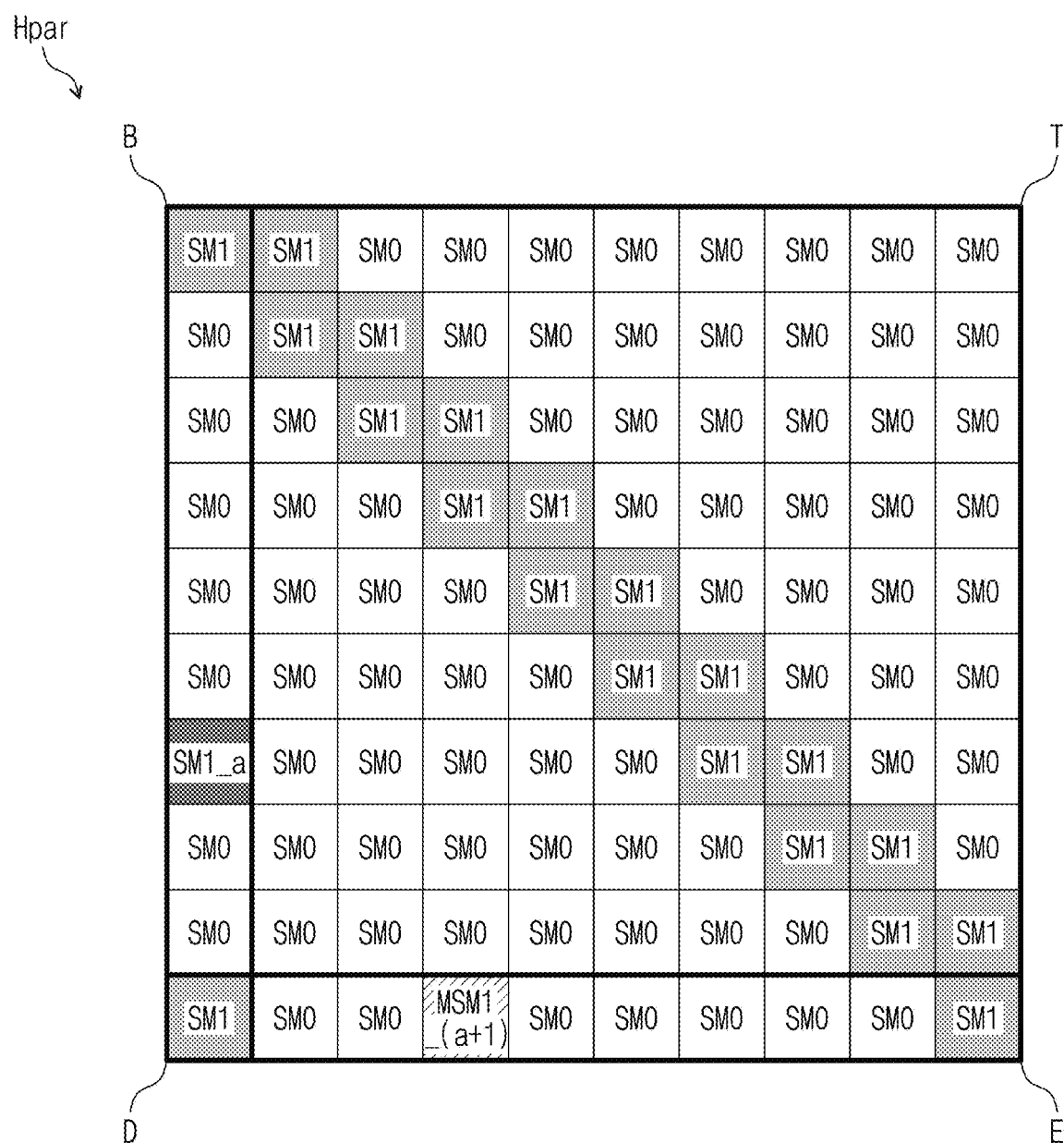
FIG. 17 is a diagram showing a parity part of a parity check matrix in which the base matrix of FIG. 12 is transformed, according to example embodiments.

FIG. 16 is a diagram illustrating mapping data stored in a mapping table in a case of "Mb'=1" according to example embodiments. FIG. 17 is a diagram showing a parity part of a parity check matrix in which the base matrix of FIG. 12 is transformed, according to example embodiments.

Referring to FIG. 16, the mapping data Data_M may include data for converting base matrix BM into the parity part Hpar. The mapping data Data_M may include data for a sub-matrix in which components of '1' or '0' are to be substituted in block matrix Bb, block matrix Tb, block matrix Db, and block matrix Eb of the base matrix.

As in Equation 10 below, a component of block matrix Bb of base matrix BM may be replaced with a sub-matrix.

$$B\_i = \begin{cases} SM1, & \text{if } i = i(Bb, 1) \\ SM1\_a & \text{else if } i = i(Bb, 2) \\ SM0, & \text{else} \end{cases} \quad \text{[Equation 10]}$$

In Equation 10, B_i denotes a sub-matrix arranged in the i-th sub-row of block matrix B. In Equation 10, in block matrix Bb of the base matrix, the first component of '1' may be replaced with the first sub-matrix SM1; the second component of '1' may be replaced with the (1−a)-th sub-matrix SM1_a; and the remaining components of '0' may be replaced with the 0-th sub-matrices SM0.

As in Equation 11 below, a component of block matrix Tb of base matrix BM may be replaced with a sub-matrix.

$$T\_i, j = \begin{cases} SM1, & \text{if } Tb\_i, j = 1 \\ SM0, & \text{else} \end{cases} \quad \text{[Equation 11]}$$

In Equation 11, T_i,j denotes a sub-matrix arranged in the i-th sub-row and the j-th sub-column of block matrix T. According to Equation 11, in the block matrix Tb of base matrix BM, components of '1' may be replaced by the first sub-matrices SM1. The remaining components of '0' may be replaced with the 0-th sub-matrices SM0.

As in Equation 12 below, a component of block matrix Eb of base matrix BM may be replaced with a sub-matrix.

$$E\_j = \begin{cases} MSM1\_(a+1), & \text{if } j = j(Eb, 1) \\ SM1, & \text{else if } j = j(Eb, 2) \\ SM0, & \text{else} \end{cases} \quad \text{[Equation 12]}$$

In Equation 12, E_j denotes a sub-matrix arranged in the j-th sub-column of block matrix E. According to Equation 12, in block matrix Eb of base matrix BM, the first component of '1' may be replaced with a masked (1−(a+1))-th sub-matrix MSM1_(a+1); the second component of '1' may be replaced with the first sub-matrix SM1; and the remaining components of '0' may be replaced with the 0-th sub-matrices SM0.

One component of '1' of block matrix Db of base matrix BM may be replaced with the first sub-matrix SM1.

Referring to FIG. 17, the parity part Hpar of the parity check matrix PCM transformed based on the mapping data Data_M may be provided.

Figure 18:
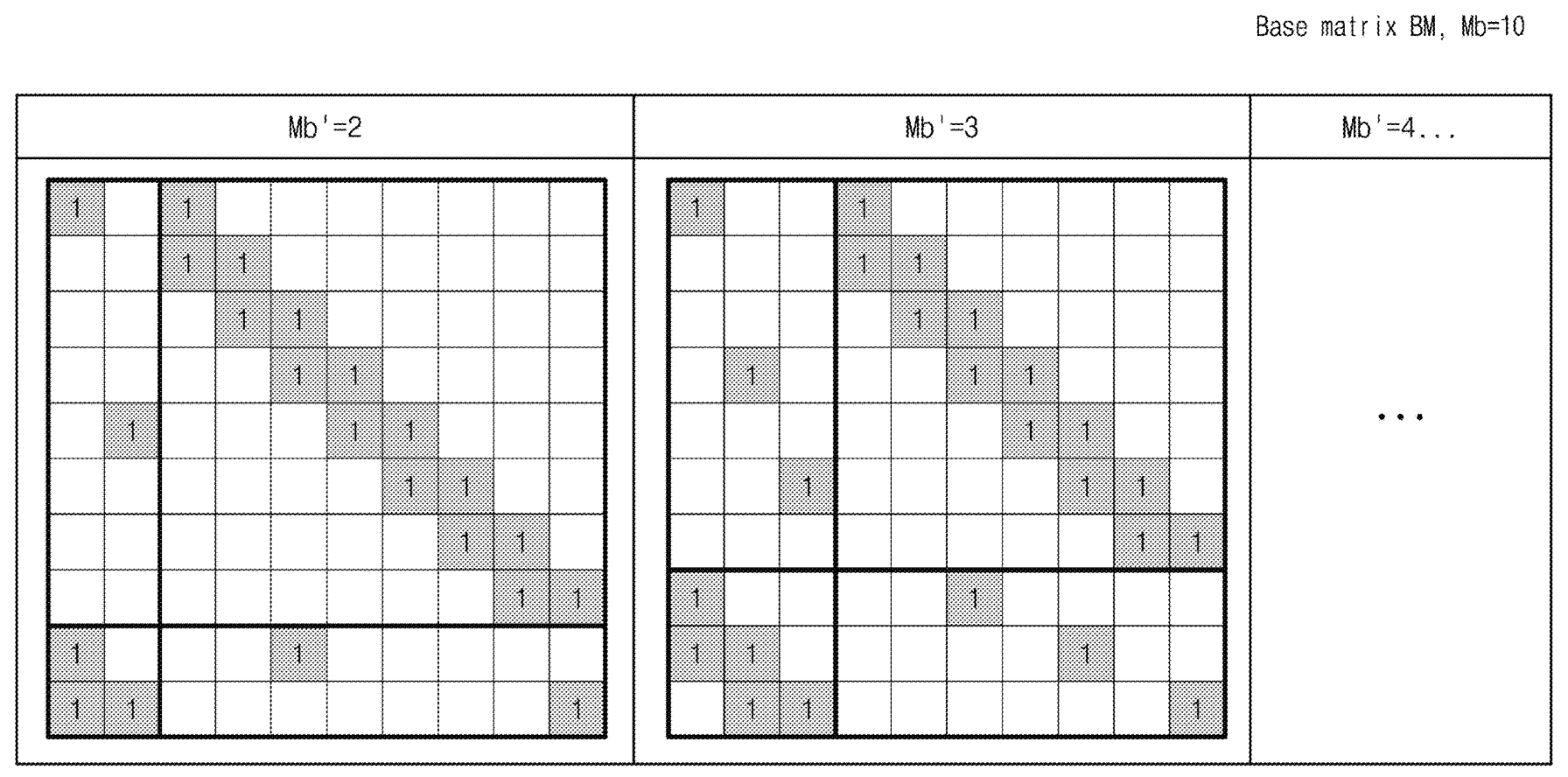
Figures 19, 20:
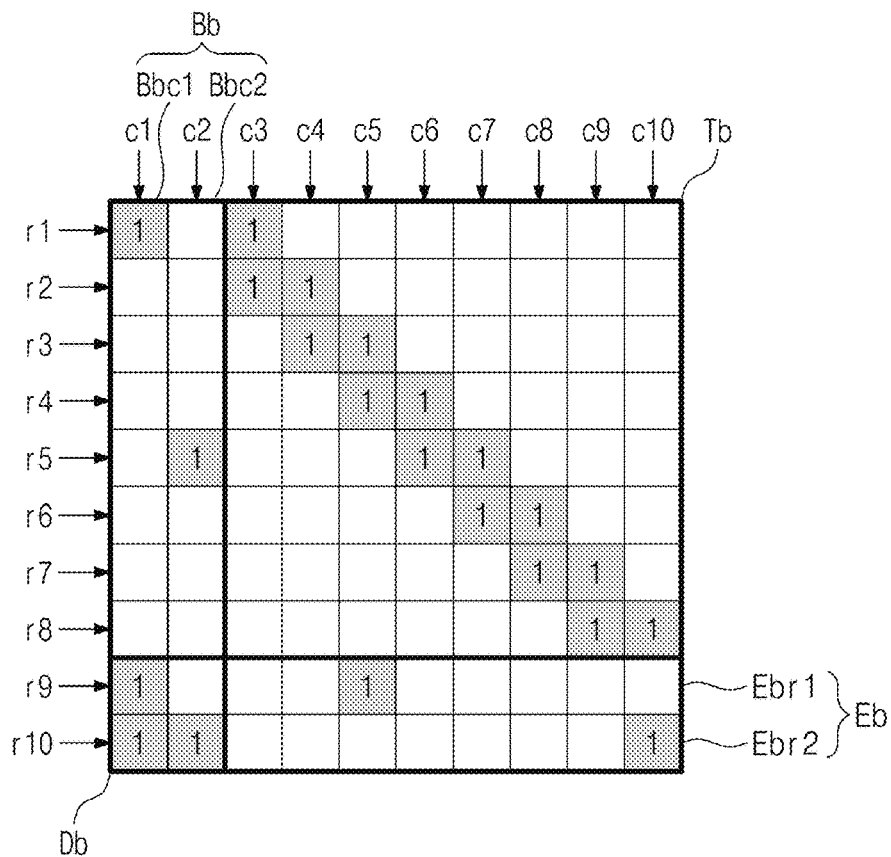
FIG. 19 is a diagram showing an example of a base matrix in a case of "Mb'=2" according to example embodiments.
FIG. 20 is a diagram showing components of block matrix Tb of FIG. 19 according to example embodiments.

FIG. 18 is a diagram showing an example of the base matrix of FIG. 11 in a case of "Mb'≥2" according to example embodiments. FIG. 19 is a diagram showing an example of a base matrix in a case of "Mb'=2" according to example embodiments. FIG. 20 is a diagram showing components of block matrix Tb of FIG. 19 according to example embodiments. FIG. 21 is a diagram showing components of the block matrix Db of FIG. 19 according to example embodiments. FIG. 22 is a diagram showing components of block matrix Bb of FIG. 19 according to example embodiments. FIG. 23 is a diagram showing components of the block matrix Eb of FIG. 19 according to example embodiments.

Referring to FIG. 18, in an embodiment, in the base matrix BM, Mb' may be 2 or more. Hereinafter, an example of the parity part Hpar in the case that Mb' is 2 will be described in detail.

Referring to FIG. 19, base matrix BM may be divided into first to tenth rows r1 to r10 and first to tenth columns c1 to c10.

Block matrix Bb may be arranged in the first to eighth rows r1 to r8 and the first and second columns c1 and c2. Block matrix Bb may include a first base column vector Bbc1 and a second base column vector Bbc2. The first base column vector Bbc1 may be arranged in the first column c1, and may include one component of '1' and a plurality of components of '0'. The second base column vector Bbc2 may be arranged in the second column c2, and may include one component of '1' and a plurality of components of '0'. For example, in the first base column vector Bbc1, one component of '1' may be arranged in the first row r1 and the first column c1, and components of '0' may be arranged at the remaining locations. For example, in the second base column vector Bbc2, one component of '1' may be arranged in the fifth row r5 and the second column c2, and components of '0' may be arranged at the remaining locations.

Block matrix Tb may be arranged in the first to eighth rows r1 to r8 and the third to tenth columns c3 to c10. Block matrix Tb may include a plurality of components of '1' and a plurality of components of '0'. The plurality of components of '1' in block matrix Tb may be arranged in a dual diagonal structure. A plurality of components of '0' may be arranged at the remaining locations other than dual diagonal components in block matrix Tb.

Block matrix Db may be arranged in the ninth and tenth rows r9 and r10 and the first and second columns c1 and c2. Block matrix Db may be composed of one component of '1'. Block matrix Db may include a plurality of components of '1'. The plurality of components of '1' in block matrix Db may be arranged in a dual diagonal structure. In block matrix Db, components of 'O' may be arranged at the remaining locations other than dual diagonal components.

Block matrix Eb may be arranged in the ninth and tenth rows r9 and r10 and the third to tenth columns c3 to c10. The block matrix Eb may include a first base row vector Ebr1 and a second base row vector Ebr2. The first base row vector Ebr1 may correspond to the first base column vector Bbc1, and the second base row vector Ebr2 may correspond to the second base column vector Bbc2.

The first base row vector Ebr1 is arranged in the ninth row r9 and may include one component of '1' and a plurality of components of '0'. The second base row vector Ebr2 is arranged in the tenth row r10 and may include one component of '1' and a plurality of components of '0'. For example, in the first base row vector Ebr1, one component of '1' may be arranged in the ninth row r9 and the fifth column c5, and components of '0' may be arranged at the remaining locations. For example, in the second base row vector Ebr2, one component of '1' may be arranged in the tenth row r10 and the tenth column c10, and components of '0' may be arranged at the remaining locations.

Referring to FIG. 20 together, components of block matrix Tb may be expressed as in Equation 9 above. Referring to FIG. 20 and Equation 9, 'i' may denote a location of a row in block matrix Tb, and 'j' may denote a location of a column in block matrix Tb.

In this specification, a location value i(Bbci) of component of '1' may be defined in each base column.

Referring to FIG. 21 together, for example, a location value i(Bbc1) of the component of '1' in the first base column vector Bbc1 is 1, and a location value i(Bbc2) of the component of '1' in the second base column vector Bbc2 is 5.

In this specification, a location value j(Ebri) of the component of '1' may be defined in each base row vector.

Referring to FIG. 22 together, for example, a location value j(Ebr1) of the component of '1' in the second base row vector Ebr2 is 3, and a location value j(Ebr2) of the component of '1' in the second base row vector Ebr2 is 8.

In an embodiment, a location value of the component of '1' in the first base column vector Bbc1 of block matrix Bb may be smaller than a location value of the component of '1' of the first base row vector Ebr1 in the block matrix Eb. For example, when the component of '1' in the first base column vector Bbc1, is placed at 'i' ('i'=1) (see FIG. 21), the component of '1' in the first base row vector Ebr1 may be placed at 'j' ('j'=2, . . . , 9) (see FIG. 22). The component of '1' in the first base row vector Ebr1 may not be placed at 'j' ('j'=1).

In an embodiment, a location value of the component of '1' in the second base column vector Bbc2 of block matrix Bb may be smaller than a location value of the component of '1' of the second base row vector Ebr2 in the block matrix Eb. For example, when the component of '1' in the second base column vector Bbc2 is placed at 'i' ('i'=5) (see FIG. 21), the component of '1' in the second base row vector Ebr2 may be placed at 'j' ('j'=6, . . . , 9) (see FIG. 22). The component of '1' in the second base row vector Ebr2 may not be placed at 'j' ('j'=1, . . . , 5).

Referring to FIG. 23 together, components of block matrix Db may be arranged as in block matrix Tb. For example, a plurality of components of '1' in block matrix Db may be arranged in a dual diagonal structure, and components of '0' may be arranged at the remaining locations other than dual diagonal components.

Figure 25:
FIG. 25 is a diagram showing a parity part of a parity check matrix in which the base matrix of FIG. 19 is transformed, according to example embodiments.

FIG. 24 is a diagram illustrating mapping data stored in a mapping table in a case of "Mb'≥2" according to example embodiments. FIG. 25 is a diagram showing a parity part of a parity check matrix in which the base matrix of FIG. 19 is transformed, according to example embodiments.

Referring to FIG. 24, the mapping data Data_M may include data for a sub-matrix in which components of '1' or '0' are to be substituted in block matrix Bb, block matrix Tb, block matrix Db, and block matrix Eb of base matrix BM.

As in Equation 13 below, a component of block matrix Bb of base matrix BM may be replaced with a sub-matrix.

$$B\_i, j = \begin{cases} SM1\_aj, & \text{if } Bb\_i, j = 1 \\ SM0, & \text{else} \end{cases} \quad \text{[Equation 13]}$$

In Equation 13, B_i,j denotes a sub-matrix arranged in the i-th sub-row and the j-th sub-column of block matrix B. According to Equation 13, in block matrix Bb of base matrix BM, the component of '1' of the j-th column may be replaced with a (1−aj)-th sub-matrix SM1_aj, and the remaining components of '0' may be replaced with the 0-th sub-matrices SM0.

The (1−aj)-th sub-matrix SM1_aj is a matrix obtained by performing a left cyclic shift 'aj' times on the first sub-matrix SM1. For example, in block matrix B, the (1−a1)-th sub-matrix SM1_a1 may be arranged in the first sub-column, and the (1−a2)-th sub-matrix SM1_a2 may be arranged in the second sub-column.

As in Equation 14 below, a component of block matrix Tb of the base matrix may be replaced with a sub-matrix. In other words, in the block matrix Tb of the base matrix, components of '1' may be replaced by the first sub-matrices SM1, and the remaining components of '0' may be replaced with the 0-th sub-matrices SM0.

As in Equation 14 below, a component of block matrix Db of base matrix BM may be replaced with a sub-matrix.

$$D\_i, j = \begin{cases} MSM1\_(aj+1), & \text{if } i = j \text{ and } Db\_i, j = 1 \\ SM1\_(aj-2), & \text{else if } Db\_i, j = 1 \\ SM0, & \text{else} \end{cases} \quad \text{[Equation 14]}$$

In Equation 14, D_i,j denotes a sub-matrix arranged in the i-th sub-row and the j-th sub-column of block matrix D. According to Equation 14, in block matrix Db of the base matrix, the component of '1' of the j-th column among the diagonal components may be replaced with a masked (1−(aj+1))-th sub-matrix MSM1_(aj+1); the component of '1' of the j-th column among the remaining components may be replaced with a (1−(aj−2))-th sub-matrix SM1_(aj−2); and the remaining components may be replaced with the 0-th sub-matrix SM0.

As in Equation 15 below, a component of block matrix Eb of base matrix BM may be replaced with a sub-matrix.

$$E\_i, j = \begin{cases} SM1, & \text{if } Eb\_i, j = 1 \\ SM0, & \text{else} \end{cases} \quad \text{[Equation 15]}$$

In Equation 15, E_i,j denotes a sub-matrix arranged in the i-th sub-row and the j-th sub-column of block matrix E. According to Equation 15, components of '1' in the block matrix Eb of base matrix BM may be replaced with the first sub-matrices SM1, and the remaining components of '0' may be replaced with the 0-th sub-matrices SM0.

Referring to FIG. 25, the parity part Hpar of the parity check matrix PCM transformed based on the mapping data Data_M may be provided.

Figure 26:
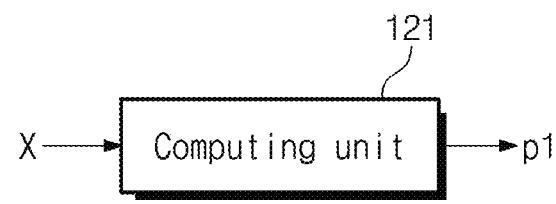
FIG. 26 is a diagram illustrating an example of a computing unit of FIG. 2 according to example embodiments.

FIG. 26 is a diagram illustrating an example of a computing unit of FIG. 2 according to example embodiments.

The computing unit 121 may be configured to generate a first parity bit p1 based on an input bit X. Hereinafter, the relationship between the input bit X and the first parity bit p1 will be first described.

Referring to Equation 2 and Equation 4, an operation for calculating a parity bit may be expressed through Equation 16 below.

$$HX = \begin{bmatrix} A & B & T \\ C & D & E \end{bmatrix} \begin{bmatrix} s \\ p_1 \\ p_2 \end{bmatrix} = 0 \Rightarrow \begin{cases} p_1 = Pi^{-1}(ET^{-1}A + C)s \\ p_2 = T^{-1}(As + Bp_1) \end{cases} \quad \text{[Equation 16]}$$

In Equation 16, Pi is defined as "ET-1B+D". The parity bit may include the first parity bit p1 and a second parity bit p2. Each of the first parity bit p1 and the second parity bit p2 may be expressed in a vector format including a plurality of bits. The first parity bit p1 may be operated with block matrix B and block matrix D. The second parity bit p2 may be operated with block matrix T and block matrix E.

Block matrix $T^{-1}$ is an inverse matrix of block matrix T. Block matrix $T^{-1}$ may be a lower triangular block matrix having the same size as block matrix T and arranged in a lower triangle with the first sub-matrices SM1. For example, block matrix $T^{-1}$ having a size of 4×4 may be expressed as Equation 17 below.

$$T^{-1} = \begin{bmatrix} SM1 & SM0 & SM0 & SM0 \\ SM1 & SM1 & SM0 & SM0 \\ SM1 & SM1 & SM1 & SM0 \\ SM1 & SM1 & SM1 & SM1 \end{bmatrix}$$

[Equation 17]

Each of block matrix A, block matrix B, block matrix C, block matrix D, block matrix T, block matrix $T^{-1}$, and block matrix E are a sparse matrix composed of components of '1' or '0', and composed of quasi-cyclic (QC) sub-matrices, and thus a matrix multiplication operation between block matrices may be performed simply. Accordingly, the complexity of computation of the parity bit, and the amount of the computation may be determined by the multiplication operation of $Pi^{-1}$ and $(ET^{-1} A+C)$s, which is an operation of calculating the shape of Pi and the first parity bit p1 according to the shape of Pi.

In Equation 16, $(ET^{-1} A+C)$s may be defined as the input bit X. The input bit X may be expressed in a vector format including a plurality of bits.

An operation of calculating the first parity bit p1 in the computing unit 121 may be simply expressed as Equation 18 below.

$$p_1 = Pi^{-1}x \qquad \text{[Equation 18]}$$

Hereafter, an embodiment of the computing unit 121 in the case of M'=1 will be described with reference to FIGS. 27 and 28, and an embodiment of the computing unit 121 in the case of M'≥2 will be described with reference to FIGS. 29 and 30.

Figure 27:
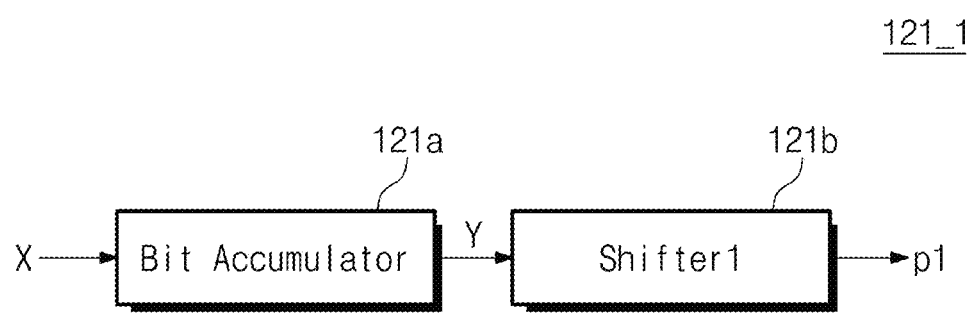
FIG. 27 is a diagram illustrating an example of a computing unit in a case of "M'=1" according to example embodiments.

FIG. 27 is a diagram illustrating an example of a computing unit in a case of "M'=1" according to example embodiments. FIG. 28 is a diagram showing that bits are operated in the computing unit of FIG. 27, according to example embodiments.

In an embodiment, when M'=1, Pi may be expressed as in Equation 19 below.

$$Pi = SMd \times SM1\_a \qquad \text{[Equation 19]}$$

In Equation 19, SMd is a dual diagonal matrix having a size of Z×Z, and is expressed as in Equation 20 below.

$$SMd = \begin{bmatrix} 1 & 0 & 0 & & 0 \\ 1 & 1 & 0 & \cdots & 0 \\ 0 & 1 & 1 & & 0 \\ \vdots & & \ddots & \ddots & 0 \\ 0 & 0 & 0 & 1 & 1 \end{bmatrix} \Bigg\} Z \qquad \text{[Equation 20]}$$

That is, Pi means a matrix obtained by performing a left-cyclic shift 'a' times on a dual diagonal matrix having a size of Z×Z.

An inverse matrix of Pi may be expressed as Equation 21 below.

$$Pi^{-1} = SM1\_(Z-a) \times SMt \qquad \text{[Equation 21]}$$

SM1_(Z-a) is a (1-(Z-a))-th sub-matrix obtained by performing the left-cyclic shift 'Z-a' times on the first sub-matrix SM1. In Equation 21, SMt is a lower triangular matrix having a size of Z×Z, and is expressed as in Equation 22 below.

$$SMt = \begin{bmatrix} 1 & 0 & 0 & & 0 \\ 1 & 1 & 0 & \cdots & 0 \\ 0 & 1 & 1 & & 0 \\ \vdots & & & \ddots & 0 \\ 1 & 1 & 1 & 1 & 1 \end{bmatrix} \Bigg\} Z \qquad \text{[Equation 22]}$$

Referring to Equation 18 and Equation 21, an operation of calculating the first parity bit p1 may include sequentially performing a first operation of multiplying the input bit X and the lower triangular matrix SMt, and a second operation of multiplying an intermediate bit generated as a result of the first operation, and a (1-(Z-a))-th sub-matrix SM1_(Z-a).

Figure 28:
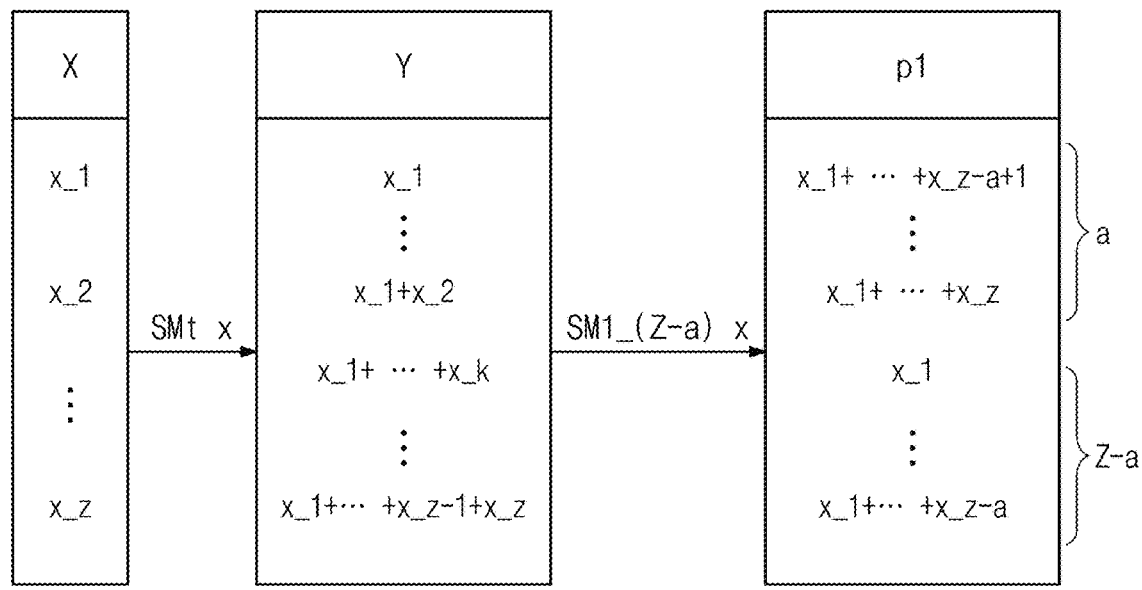
FIG. 28 is a diagram showing that bits are operated in the computing unit of FIG. 27, according to example embodiments.

Referring to FIGS. 27 and 28, the computing unit 121 may include a bit accumulator 121*a* and a first shifter 121*b*.

The bit accumulator 121*a* may be configured to receive the input bit X. The input bit X may be expressed in a vector format including a plurality of input bits. For example, the input bit X may include first to Z-th input bits x_1 to x_Z (see FIG. 28).

The bit accumulator 121*a* may be configured to generate an intermediate bit Y by performing the first operation of multiplying the input bit X and the lower triangular matrix SMt. The intermediate bit Y may be expressed in a vector format including a plurality of intermediate bits. Each of the intermediate bits Y may be generated by sequentially accumulating a plurality of input bits thus received. For example, the intermediate bit Y may include first to Z-th intermediate bits (see FIG. 28). The first intermediate bit is the first input bit x_1, and the second intermediate bit is obtained by accumulating the first and second input bits x_1 and x_2. Likewise, the k-th intermediate bit ('k'=1~Z) is obtained by accumulating the first to k-th input bits x_1 to x_k.

The intermediate bit Y generated by the bit accumulator 121*a* may be provided to the first shifter 121*b*.

The first shifter 121*b* may be connected to the bit accumulator 121*a*. The first shifter 121*b* may be configured to generate the first parity bit p1 by performing the second operation of multiplying the intermediate bit and the (1-(Z-a))-th sub-matrix SM1_(Z-a). The first parity bit p1 may be a bit obtained by performing an up-cyclic shift 'Z-a' times on the intermediate bit (see FIG. 28).

Figure 29:
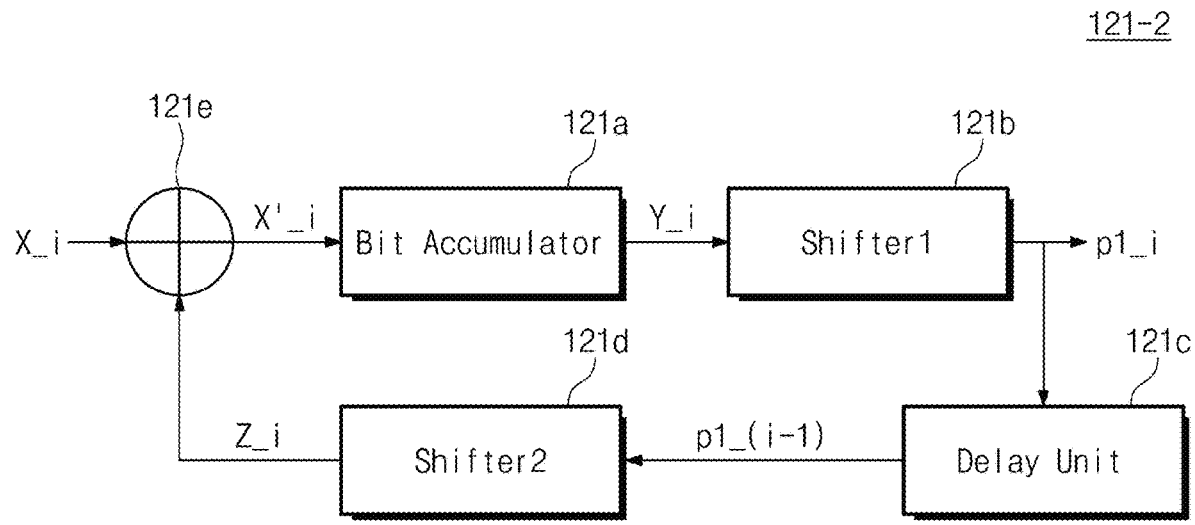
FIG. 29 is a diagram showing an example of a computing unit in a case of "M'=2" according to example embodiments.

FIG. 29 is a diagram showing an example of a computing unit in a case of "M'≥2" according to example embodiments. FIG. 30 is a diagram showing that bits are operated in the computing unit of FIG. 29, according to example embodiments.

In an embodiment, for convenience of description, it is assumed that M' is 3. It should be understood that the same method may be applied even when M' has a value other than 1.

Pi is a matrix having a size of 3×3 and may be expressed as Equation 23 below.

$$Pi = \begin{bmatrix} Pi\_1,1 & Pi\_1,2 & Pi\_1,3 \\ Pi\_2,1 & Pi\_2,2 & Pi\_2,3 \\ Pi\_3,1 & Pi\_3,2 & Pi\_3,3 \end{bmatrix} \qquad \text{[Equation 23]}$$

In Equation 23, Pi_i,j denotes a sub-matrix arranged in the i-th sub-row and j-th sub-column of matrix Pi.

On the basis of the definition "ET-1B+D" of Pi, Pi may be expressed as in Equation 24 below.

$$Pi = \begin{array}{|c|c|c|} \hline SMd \times SM1\_a1 & SM0 & SM0 \\ \hline SM1\_(a1-2) & SMd \times SM1\_a2 & SM0 \\ \hline SM0 & SM1\_(a2-2) & SMd \times SM1\_a3 \\ \hline \end{array} \quad \text{[Equation 24]}$$

In Equation 24, SMd is a dual diagonal matrix expressed as in Equation 20 above.

Referring to Equation 24, a matrix obtained by performing a left-cyclic shift 'aj' times on a dual diagonal matrix having a size of Z×Z may be arranged in a diagonal component of the j-th sub-column of Pi; a (1−(aj−2))-th sub-matrix (SM1_(aj−2)) having a size of Z×Z may be arranged immediately below the diagonal component of the j-th sub-column of Pi; and the 0-th sub-matrices SM0 may be arranged at the remaining locations. The sub-matrix arranged immediately below the diagonal component of the j-th sub-column of Pi may be the same as a sub-matrix arranged immediately below the diagonal component of the j-th sub-column of block matrix D. For example, Pi_2,1 may be the same as D_2,1. Pi_3,2 may be the same as D_3,2.

An inverse matrix of Pi may be expressed as Equation 25 below.

$$Pi^{-1} = \begin{array}{|c|c|c|} \hline Pi^{-1}\_1,1 & Pi^{-1}\_1,2 & Pi^{-1}\_1,3 \\ \hline Pi^{-1}\_2,1 & Pi^{-1}\_2,2 & Pi^{-1}\_2,3 \\ \hline Pi^{-1}\_3,1 & Pi^{-1}\_3,2 & Pi^{-1}\_3,3 \\ \hline \end{array} \quad \text{[Equation 25]}$$

In Equation 25, $Pi^{-1}\_i,j$ denotes a sub-matrix arranged in the i-th sub-row and j-th sub-column of matrix $Pi^{-1}$.

Because $Pi \times Pi^{-1}$ is a unit matrix, the inverse matrix of Pi may be expressed as Equation 26 below based on $Pi \times Pi^{-1}$.

[Equation 26]

$$Pi^{-1} = \begin{array}{|c|c|c|} \hline SM1\_(Z-a1) \times SMt & SM0 & SM0 \\ \hline SM1\_(Z-a2) \times SMT \times Pi\_2,1 \times SM1\_(Z-a1) \times SMt & SM1\_(Z-a2) \times SMt & SM0 \\ \hline SMt \times SM1\_(Z-a3) \times Pi\_3,2 \times Pi^{-1}\_2,1 & SM1\_(Z-a3) \times SMT \times Pi\_3,2 \times SM1\_(Z-a2) \times SMt & SM1\_(Z-a3) \times SMt \\ \hline \end{array}$$

In Equation 26, SMt is the lower triangular matrix SMt expressed as in Equation 22 described above.

Referring to Equation 18 and Equation 26, the first parity bit p1 may be expressed as in Equation 27 below.

$$Pi^{-1} \cdot X = p1 = \begin{array}{|c|} \hline p1\_1 \\ \hline p1\_2 \\ \hline p1\_3 \\ \hline \end{array} = \begin{array}{|c|} \hline SM1\_(Z-a1) \times SMt \times X\_1 \\ \hline SM1\_(Z-a2) \times SMt \times (Pi\_2,1 \times P1\_1 + X\_2) \\ \hline SM1\_(Z-a3) \times SMt \times (Pi\_3,2 \times P1\_2 + X\_3) \\ \hline \end{array} \quad \text{[Equation 27]}$$

In Equation 27, X denotes the input bit X, and p1 denotes the first parity bit. The input bit X may include a first bit X_1, a second bit X_2, and a third bit X_3. The first parity bit p1 may include a 1-1st parity bit p1_1, a 1-2nd parity bit p1_2, and a 1-3rd parity bit p1_3.

Referring to Equation 27, the 1-1st parity bit p1_1 may be generated by multiplying the first bit X_1 and the lower triangular matrix SMt and then multiplying the multiplied result by the (1−(Z-a1))-th sub-matrix SM1_(Z-a1). The 1-2nd parity bit p1_2 may be generated by multiplying the 1-1st parity bit p1_1 by Pi_2,1, summing the multiplied result and the second bit X_2, multiplying the summed result by the lower triangular matrix SMt, and multiply the multiplied result by a (1−(Z-a2))-th sub-matrix SM1_(Z-a2). The 1-3rd parity bit p1_3 may be generated by multiplying the 1-2nd parity bit p1_2 and Pi_3,2, summing the multiplied result and the third bit X_3, multiplying the summed result by the lower triangular matrix SMt, and multiplying the multiplied result by a (1−(Z-a3))-th sub-matrix SM1_(Z-a3).

In the same method, when M' is greater than 2, a (1−i)-th parity bit ('i' is a natural number greater than or equal to 2) may be generated by multiplying a (1−(i−1))-th parity bit by Pi_i, (i−1), summing the multiplied result and the i-th bit, multiplying the summed result and the lower triangular matrix SMt, and multiplying the multiplied result by a (1−(Z-ai))-th sub-matrix. In other words, the (1−i)-th parity bit may be calculated by performing a recursive operation based on a (1−(i−1))-th parity bit.

In Equation 27, Pi_2,1 and Pi_3,2 are the same sub-matrix as D_2,1 and D_3,2 of block matrix D, respectively. D_2,1 is a (1−(a1-2))-th sub-matrix, D_3,2 is a (1−(a2-2))-th sub-matrix. In other words, Pi_i, (i−1) is a (1−(a(i−1)−2))-th sub-matrix (see FIG. 7).

Referring to Equation 27, an operation of calculating the first parity bit p1 may include a first operation of multiplying the first bit X_1 by the lower triangular matrix SMt, a second operation of multiplying the (1−(Z-a1))-th sub-matrix SM1_(Z-a1), a third operation of multiplying a (1−(a(i−1)−2))-th sub-matrix, and a fourth operation of summing the i-th bit. The first to fourth operations may be repeatedly performed until all the first parity bits are calculated.

Figure 30:
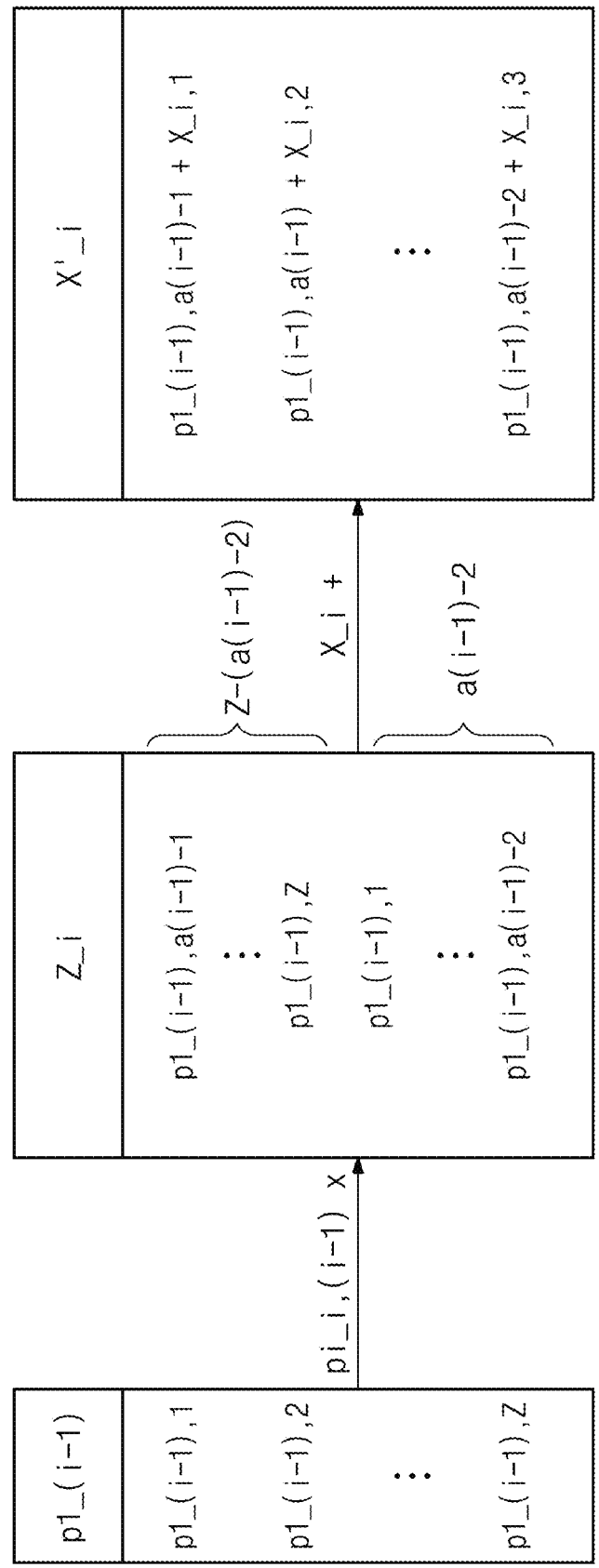
FIG. 30 is a diagram showing that bits are operated in the computing unit of FIG. 29, according to example embodiments.

Referring to FIGS. 29 and 30, the computing unit 121 may include the bit accumulator 121a, the first shifter 121b, a delay unit 121c, a second shifter 121d, and an adder 121e.

The bit accumulator 121a may be configured to receive an input bit X'_i or a summation bit X'_i. When calculating the 1-1st parity bit p1_1, the bit accumulator 121a may receive the input bit X_i. When calculating the (1−i)-th parity bit p1_i ('i' is a natural number greater than or equal to 2), the bit accumulator 121a may receive the summation bit X'_i.

The input bit X_i and the summation bit X'_i may be expressed in a vector format including a plurality of bits.

The bit accumulator 121a may be configured to generate an intermediate bit Y_i by performing the first operation of multiplying the input bit X_i and the lower triangular matrix SMt. An operation of the bit accumulator 121a may be substantially the same as that described with reference to FIGS. 27 and 28.

The intermediate bit Y_i may be expressed in a vector format including a plurality of bits.

The first shifter 121b may be configured to generate a (1−i)-th parity bit p1_i by performing the second operation of multiplying the intermediate bit Y_i by a (1−(Z−ai))-th sub-matrix. An operation of the first shifter 121b may be substantially the same as that described with reference to FIGS. 27 and 28. The first shifter 121b may be configured to generate a first parity bit p1_i by performing the second operation of multiplying the intermediate bit Y_i by a (1−(Z−ai))-th sub-matrix SM1_(Z−ai).

The delay unit 121c may be configured to receive and delay the (1−i)-th parity bit p1_i. Accordingly, the (1−i)-th parity bit delayed by the delay unit 121c is expressed as a (1−(i−1))-th parity bit p1_(i−1).

The second shifter 121d may be configured to generate a transformation bit Z_i by performing the third operation of multiplying a (1−(i−1))-th parity bit by a (1−(a(i−1)−2))-th sub-matrix. The transformation bit Z_i may be a bit obtained by performing an up-cyclic shift "a (i−1)-2" times on the (1−(i−1))-th parity bit p1_(i−1) (see FIG. 30).

The transformation bit Z_i may be expressed in a vector format including a plurality of bits.

The adder 121e may be configured to generate the summation bit X'_i by performing the fourth operation of summing the i-th bit to the transformation bit Z_i. The summation bit X'_i may be the sum of each bit of the transformation bit Z_i and each of the i-th bit (see FIG. 30). The adder 121e may be configured to provide the summation bit X'_i as an input to the bit accumulator 121a.

Figure 31:
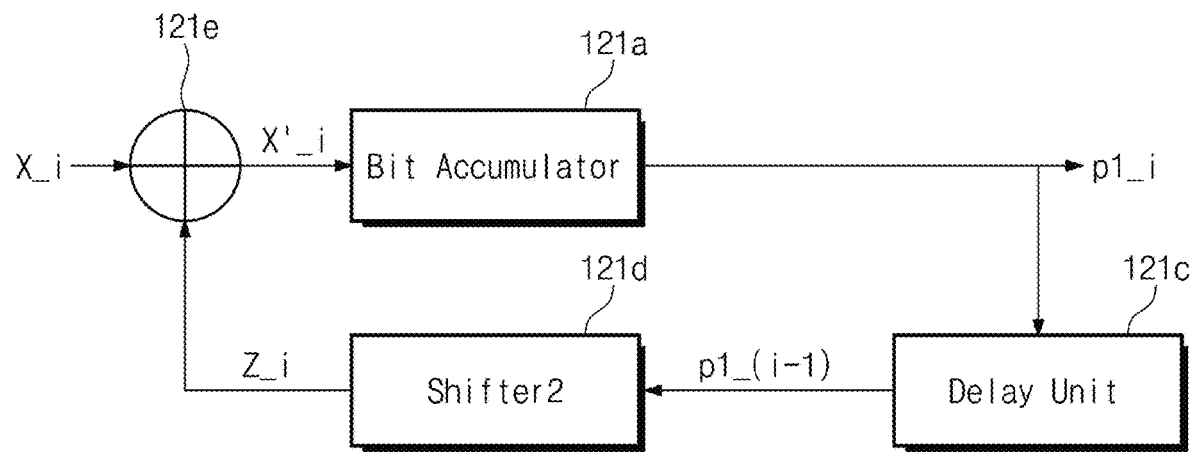
FIG. 31 is a diagram illustrating an example of a computing unit when all values 'aj' are 0, according to example embodiments.

FIG. 31 is a diagram illustrating an example of a computing unit when all values 'aj' are 0, according to example embodiments.

Referring to FIG. 31, when all 'aj'=0, an embodiment of the computing unit 121 is provided. Because all 'aj' are independent of each other and has no constraints, it does not matter when all 'aj' are set to 0. In this case, unlike the illustration in FIG. 29, the computing unit 121 may not be provided with the first shifter 121b, and an output of the bit accumulator 121a may be output as a (1−i)-th parity bit p1_i.

Figure 32:
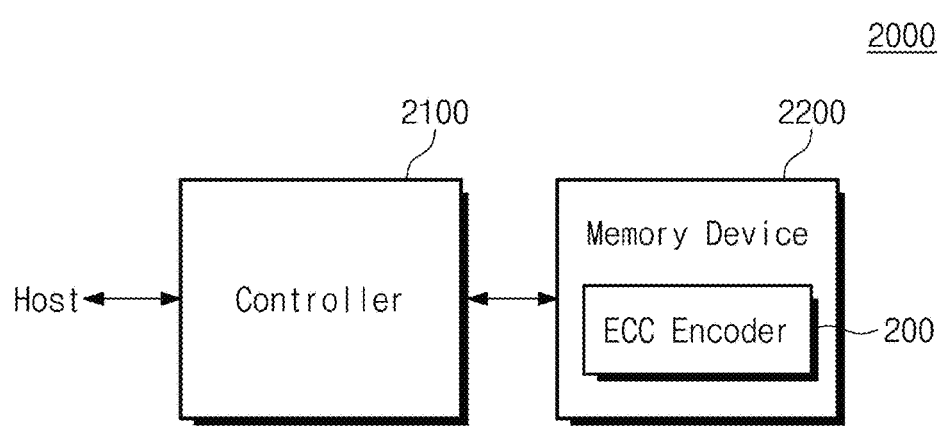
FIG. 32 is a diagram showing an example of a memory system including an ECC encoder, according to example embodiments.

FIG. 32 is a diagram showing an example of a memory system including an ECC encoder, according to example embodiments.

Referring to FIG. 32, a memory system 2000 includes a controller 2100 and a memory device 2200. Herein, one of the memory system 2000, the controller 2100, and the memory device 2200 may be referred to as a semiconductor device.

As illustrated in FIG. 1, the controller 2100 is connected to a host and the memory device 2200. The controller 2100 is configured to access the memory device 2200 in response to a request from the host.

The memory device 2200 includes an ECC encoder 200. The ECC encoder 200 performs encoding using an error correcting code on data provided from the controller 2000. For example, the memory device 2200 may be configured to receive data from the controller 2100 in a form of the codeword CW.

The ECC encoder 200 may have substantially the same configuration and may perform the same functions as that described with reference to FIGS. 2 to 31.

Figure 33:
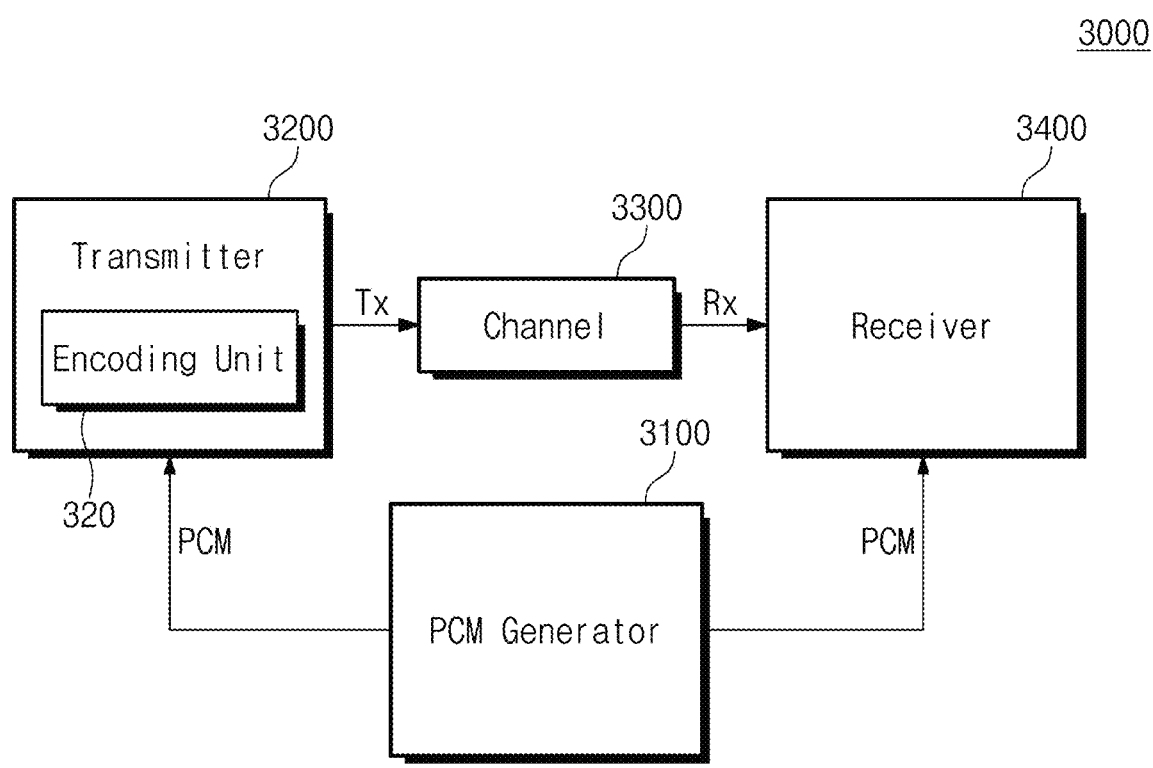
FIG. 33 is a diagram showing an example of a communication system including an ECC encoder, according to example embodiments.

FIG. 33 is a diagram showing an example of a communication system including an ECC encoder, according to example embodiments.

Referring to FIG. 33, a communication system 3000 includes a PCM generator 3100, a transmitter 3200, a channel 3300, and a receiver 3400. The communication system 3000 may encode the codeword CW by using LDPC.

The PCM generator 3100 may be configured to generate a parity check matrix PCM. The parity check matrix PCM generated by the PCM generator 3100 may be divided into the information part Hinfo and the parity part Hpar, and the parity part Hpar may be the same as that described in FIGS. 5 to 8.

The transmitter 3200 may be configured to encode the codeword CW based on the parity check matrix PCM and to generate a transmission signal Tx. The transmission signal Tx may include information about the encoded codeword.

The transmitter 3200 may include an encoding unit 320 configured to encode a codeword. The encoding unit 320 may have substantially the same configuration and may perform the same function as the ECC encoder 100 of FIG. 2.

The transmission signal Tx generated by the transmitter 3200 may be provided to the receiver 3400 through the channel 3300. An error may occur in the encoded codeword while the transmission signal Tx passes through the channel 3300.

The receiver 3400 may be configured to receive a signal (hereinafter, referred to as a "reception signal Rx") passing through the channel 3300 and the parity check matrix PCM. The receiver 3400 may be configured to correct an error of the reception signal Rx based on the received reception signal Rx and the parity check matrix PCM. For example, the receiver 3400 may include an ECC decoder that corrects an error of the reception signal Rx.

The above description refers to detailed embodiments for carrying out the present disclosure Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments described above, it will be apparent to those of ordinary skill in the art that various changes and modifications may be made thereto without departing from the spirit and scope of the present disclosure as set forth in the following claims.

In an embodiment of the present disclosure, a parity part in the parity check matrix has a characteristic structure, and the corresponding structure provides an ECC encoder capable of encoding a codeword with a small amount of computation by utilizing structural features as well as excellent correction capability.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An error correcting code (ECC) encoding circuit configured to encode a codeword based on a parity check matrix and to generate an encoded codeword (ECW) including an information bit and a parity bit,
    wherein the ECC encoding circuit includes:
    a parity check matrix (PCM) generator configured to generate the parity check matrix; and
    an encoding unit coupled to the PCM generator and configured to generate the encoded codeword based on the codeword and the parity check matrix;
    wherein the parity check matrix is divided into an information part corresponding to the information bit and a parity part corresponding to the parity bit, and
    wherein the parity part includes:
    a block matrix T including a plurality of first sub-matrices arranged in a dual diagonal structure;
    a block matrix B including a first sub-matrix and a (1−a)-th sub-matrix, a being a natural number greater than or equal to 1;

a block matrix D composed of the first sub-matrix; and
a block matrix E including the first sub-matrix and a masked (1−(a+1))-th sub-matrix,
wherein the block matrix B and the block matrix D are positioned in the same sub-column,
wherein the block matrix T and the block matrix E are positioned in the same sub-column,
wherein a location where the first sub-matrix is placed in the block matrix B precedes a location where the masked (1−(a+1))-th sub-matrix is placed in the block matrix E,
wherein a location where the (1−a)-th sub-matrix is placed in the block matrix B precedes a location where the first sub-matrix is placed in the block matrix E,
wherein the first sub-matrix of each of the block matrices T, B, D and E is defined as a unit matrix having a size of Z×Z, Z being a natural number,
wherein the (1−a)-th sub-matrix is defined as a matrix obtained by performing a left-cyclic shift 'a' times on the first sub-matrix, and
wherein the masked (1−(a+1))-th sub-matrix is defined as a matrix in which a first row is masked in a matrix obtained by performing a left-cyclic shift "a+1" times on the first sub-matrix.

2. The ECC encoding circuit of claim 1,
wherein a relationship between the parity check matrix and the encoded codeword is expressed based on Equation 1:

$$H \cdot ECW = [Hinfo \;\; Hpar]\begin{bmatrix} s \\ p \end{bmatrix} = Hinfo \cdot s + Hpar \cdot p = 0,$$ [Equation 1]

and
wherein, in Equation 1, the 'H' denotes the parity check matrix, the ECW denotes the encoded codeword, the Hinfo denotes the information part of the PCM, the Hpar denotes the parity part of the PCM, the 's' denotes the information bit of the ECW, and the 'p' denotes the parity bit of the ECW.

3. The ECC encoding circuit of claim 2, wherein the encoding unit is further configured to perform an operation for calculating the parity bit, and
wherein the operation for calculating the parity bit is expressed based on Equation 2:

$$p = Hpar^{-1}(Hinfo \cdot s).$$ [Equation 2]

4. The ECC encoding circuit of claim 3, wherein the parity bit includes a first parity bit operated with the block matrix B and the block matrix D and a second parity bit operated with the block matrix T and the block matrix E, and
wherein the encoding unit includes a computing unit configured to calculate the first parity bit.

5. The ECC encoding circuit of claim 2, wherein the PCM generator includes:
a base matrix generator configured to generate a base matrix including a block matrix Bb, a block matrix Tb, a block matrix Db, and a block matrix Eb, which respectively correspond to the block matrix B, the block matrix T, the block matrix D, and the block matrix E of the parity part and each of which is composed of components of '1' or '0';
a mapping table configured to store mapping data including data for sub-matrices with which components respectively corresponding to the block matrix Bb, the block matrix Tb, the block matrix Db, and the block matrix Eb of the base matrix are to be replaced; and
a matrix transform unit configured to generate the parity check matrix including the parity part based on the base matrix and the mapping data.

6. The ECC encoding circuit of claim 5, wherein a weight of a column divided into the block matrix Bb and the block matrix Db is 3, and
wherein a weight of at least one of columns divided into the block matrix Tb and the block matrix Eb is 3.

7. The ECC encoding circuit of claim 5, wherein the block matrix Bb includes first and second components of '1' and a plurality of components of '0',
wherein the block matrix Eb includes first and second components of '1' and a plurality of components of '0',
wherein the block matrix Tb includes a plurality of components of '1' arranged in a dual diagonal structure, and
wherein the block matrix Db composed of one component of '1'.

8. The ECC encoding circuit of claim 7, wherein a location value of the first component of '1' of the block matrix Bb is smaller than a location value of the first component of '1' of the block matrix Eb, and
wherein a location value of the second component of '1' of the block matrix Bb is smaller than a location value of the second component of '1' of the block matrix Eb.

9. The ECC encoding circuit of claim 8, wherein the matrix transform unit is configured to generate the parity part by replacing:
the first component of '1' of the block matrix Bb with the first sub-matrix,
the second component of '1' of the block matrix Bb with the (1−a)-th sub-matrix,
the first component of '1' of the block matrix Eb with the masked (1−(a+1))-th sub-matrix, and
the second component of '1' of the block matrix Eb with the first sub-matrix.

10. The ECC encoding circuit of claim 1, wherein rows of the parity part correspond to check nodes,
wherein columns of the parity part correspond to variable nodes,
wherein at least one of variable nodes divided into the block matrix B and the block matrix D has a weight of 3, and
wherein at least one of variable nodes divided into the block matrix T and the block matrix E has a weight of 3.

11. A semiconductor device comprising:
an error correcting code (ECC) encoder configured to encode a codeword based on a parity check matrix and to generate an encoded codeword (ECW) including an information bit and a parity bit,
wherein the ECC encoder includes:
a parity check matrix (PCM) generator configured to generate the parity check matrix; and
an encoding unit coupled to the PCM generator and configured to generate the encoded codeword based on the codeword and the parity check matrix;
wherein the parity check matrix is divided into an information part corresponding to the information bit and a parity part corresponding to the parity bit, and wherein the parity part includes:

a plurality of sub-rows and a plurality of sub-columns;

a block matrix T including a plurality of first sub-matrices arranged in a dual diagonal structure;

a block matrix B including:

a first column vector positioned in a first sub-column of the plurality of sub-columns and including a (1–a1)-th sub-matrix, a1 being an integer greater than or equal to 0, and a second column vector positioned in a second sub-column of the plurality of sub-columns and including a (1–a2)-th sub-matrix, a2 being an integer greater than or equal to 0;

a block matrix E including:

a first row vector positioned in a first sub-row of the plurality of sub-rows and including a first sub-matrix, and a second row vector positioned in a second sub-row of the plurality of sub-rows and including the first sub-matrix; and a block matrix D including: a masked (1–(a1+1))-th sub-matrix positioned in the first sub-column and the first sub-row, a (1–(a1–2))-th sub-matrix positioned in the first sub-column and the second sub-row, and a masked (1–(a2+1))-th sub-matrix positioned in the second sub-column and the second sub-row, wherein a location where the (1–a1)-th sub-matrix of the block matrix B is placed in the first column vector precedes a location where the first sub-matrix of the block matrix E is placed in the first row vector, wherein a location where the (1–a2)-th sub-matrix of the block matrix B is placed in the second column vector precedes a location where the first sub-matrix of the block matrix E is placed in the second row vector, wherein the first sub-matrix is defined as a unit matrix having a size of Z×Z, Z being a natural number, wherein the (1–aj)-th sub-matrix is defined as a matrix obtained by performing a left-cyclic shift 'aj' times on the first sub-matrix, j being 1 or 2, wherein the masked (1–(aj+1))-th sub-matrix is defined as a matrix in which a first row is masked in a matrix obtained by performing a left-cyclic shift "aj+1" times on the first sub-matrix, and wherein the (1–(aj–2))-th sub-matrix is defined as a matrix obtained by performing a left-cyclic shift "aj–2" times on the first sub-matrix.

12. The semiconductor device of claim 11, wherein a relationship between the parity check matrix and the encoded codeword is expressed based on Equation 1:

$$H \cdot ECW = [Hinfo \quad Hpar]\begin{bmatrix} s \\ p \end{bmatrix} = Hinfo \cdot s + Hpar \cdot p = 0, \quad \text{[Equation 1]}$$

and wherein, in Equation 1, the 'H' denotes the parity check matrix, the ECW denotes the encoded codeword, the Hinfo denotes the information part of the PCM, the Hpar denotes the parity part of the PCM, the 's' denotes the information bit of the ECW, and the 'p' denotes the parity bit of the ECW.

13. The semiconductor device of claim 12, wherein the PCM generator includes:

a base matrix generator configured to generate a base matrix including a block matrix Bb, a block matrix Tb, a block matrix Db, and a block matrix Eb, which respectively correspond to the block matrix B, the block matrix T, the block matrix D, and the block matrix E of the parity part and each of which is composed of components of '1' or '0';

a mapping table configured to store mapping data including data for sub-matrices with which components respectively corresponding to the block matrix Bb, the block matrix Tb, the block matrix Db, and the block matrix Eb of the base matrix are to be replaced; and a matrix transform unit configured to generate the parity check matrix including the parity part based on the base matrix and the mapping data.

14. The semiconductor device of claim 13, wherein the block matrix Bb includes:

a first base column vector including one component of '1' and a plurality of components of '0', and a second base column vector including one component of '1' and a plurality of components of '0', wherein the block matrix Eb includes:

a first base row vector including one component of '1' and a plurality of components of '0', and a second base row vector including one component of '1' and a plurality of components of '0', wherein each of the block matrix Db and the block matrix Tb includes a plurality of components of '1' arranged in a dual diagonal structure, wherein a location value of the component of '1' in the first base column vector of the block matrix Bb is smaller than a location value of the component of '1' in the first base row vector of the block matrix Eb, and wherein a location value of the component of '1' in the second base column vector of the block matrix Bb is smaller than a location value of the component of '1' in the second base row vector of the block matrix Eb.

15. The semiconductor device of claim 14, wherein the matrix transform unit is configured to generate a parity part by replacing:

the component of '1' of the first base column vector with the (1–a1)-th sub-matrix, the component of '1' of the second base column vector with the (1–a2)-th sub-matrix, and the component of '1' of each of the first base row vector and the second base row vector with the first sub-matrix.

* * * * *